United States Patent
Self

(10) Patent No.: US 7,375,593 B2
(45) Date of Patent: May 20, 2008

(54) CIRCUITS AND METHODS OF GENERATING AND CONTROLLING SIGNALS ON AN INTEGRATED CIRCUIT

(76) Inventor: Paul William Ronald Self, 3368 Creighton Pl., Santa Clara, CA (US) 95051

(*) Notice: Subject to any disclaimer, the term of this patent is extended or adjusted under 35 U.S.C. 154(b) by 0 days.

(21) Appl. No.: 11/384,913

(22) Filed: Mar. 20, 2006

(65) Prior Publication Data

US 2006/0158274 A1    Jul. 20, 2006

Related U.S. Application Data

(63) Continuation-in-part of application No. 11/329,779, filed on Jan. 11, 2006, and a continuation-in-part of application No. 11/200,472, filed on Aug. 9, 2005, and a continuation-in-part of application No. 11/038,560, filed on Jan. 19, 2005.

(60) Provisional application No. 60/663,655, filed on Mar. 21, 2005, provisional application No. 60/645,837, filed on Jan. 21, 2005.

(51) Int. Cl.
*H03L 7/00* (2006.01)
*H03L 7/04* (2006.01)
(52) U.S. Cl. ............................ 331/16; 327/157; 327/161
(58) Field of Classification Search ................ 327/157, 327/161; 331/16
See application file for complete search history.

(56) References Cited

U.S. PATENT DOCUMENTS

| RE27,092 | E | * | 3/1971 | Stifter et al. ................ 342/98 |
|---|---|---|---|---|
| 4,042,891 | A | | 8/1977 | Levine |
| 4,115,744 | A | | 9/1978 | Lewis |
| 4,338,569 | A | | 7/1982 | Petrich |
| 4,387,347 | A | | 6/1983 | Pierrot |
| 4,463,321 | A | | 7/1984 | Horner |
| 4,922,141 | A | | 5/1990 | Lofgren et al. |
| 5,204,640 | A | | 4/1993 | Logan, Jr. |
| 5,570,054 | A | | 10/1996 | Takla |
| 5,687,261 | A | | 11/1997 | Logan |
| 5,696,951 | A | | 12/1997 | Miller |
| 5,949,290 | A | | 9/1999 | Bertram |
| 6,329,648 | B1 | | 12/2001 | Delatorre |
| 6,373,740 | B1 | | 4/2002 | Forbes et al. |
| 6,525,618 | B2 | | 2/2003 | Wood |
| 6,556,089 | B2 | | 4/2003 | Wood |
| 6,593,821 | B2 | * | 7/2003 | Kobayashi ................ 331/74 |
| 6,622,370 | B1 | * | 9/2003 | Sherman et al. ............ 29/600 |
| 6,741,109 | B1 | | 5/2004 | Huang et al. |

(Continued)

OTHER PUBLICATIONS

Graf, Rudolf F., Modern Dictionary of Electronics, 1999, Newnes Publications, 7th ed., pp. 183,797.*

(Continued)

*Primary Examiner*—Benny Lee
*Assistant Examiner*—James Goodley
(74) *Attorney, Agent, or Firm*—Fountainhead Law Group PC; Chad R. Walsh

(57) ABSTRACT

Embodiments of the present invention include an integrated circuit comprising an integrated transmission line, wherein the integrated transmission line is used as a timing reference for a feedback loop and wherein the feedback loop and the transmission line are integrated on a single integrated circuit. The feedback loop and transmission line may be used as a frequency generator or controlled delay, for example. In another embodiment, the present invention includes a timing loop with first and second commutating phase detectors.

16 Claims, 21 Drawing Sheets

U.S. PATENT DOCUMENTS

| | | | |
|---|---|---|---|
| 6,816,020 | B2 | 11/2004 | Wood |
| 6,897,691 | B2 | 5/2005 | Chen et al. |
| 7,085,336 | B2 * | 8/2006 | Lee et al. .................. 375/354 |
| 7,119,591 | B1 * | 10/2006 | Lin ............................ 327/158 |
| 2003/0119310 | A1 | 6/2003 | Chow |
| 2006/0158274 | A1 | 7/2006 | Self |

OTHER PUBLICATIONS

Andress, et al., "Recent Developments in Standing-Wave Oscillator Design: Review", RFIC Symposium, 2004, Digest of Papers, Jun. 6-8, 2004, pp. 119-12, *2004 IEEE*.

Andress, et al., "Standing Wave Oscillators Utilizing Wave-Adaptive Tapered Transmission Lines", Mar. 2005, vol. 40., No. 3, pp. 638-651, *IEEE Journal of Solid-State Circuits*.

Andress, et al., "A Circular Standing Wave Oscillator", Feb. 18, 2004, *IEEE International Solid-State Circuits Conference*.

Johnson, et al., "High-Speed Digital Design: A Handbook of Black Magic", 1st Edition, Apr. 8, 1993, p. 6, *Prentice Hall PTR*, USA.

Wilkins, "All-Silicon Copernicus Clock Generates 528MHz Clock Signal with no External Components", Mobius Microsystems press release, Jun. 22, 2005.

\* cited by examiner

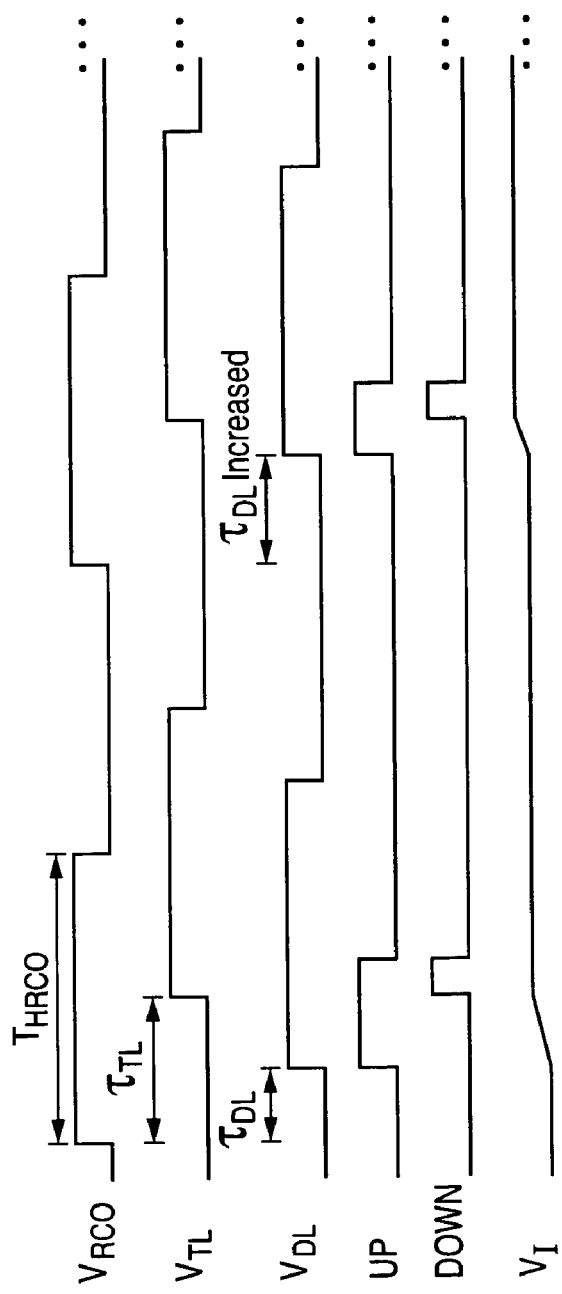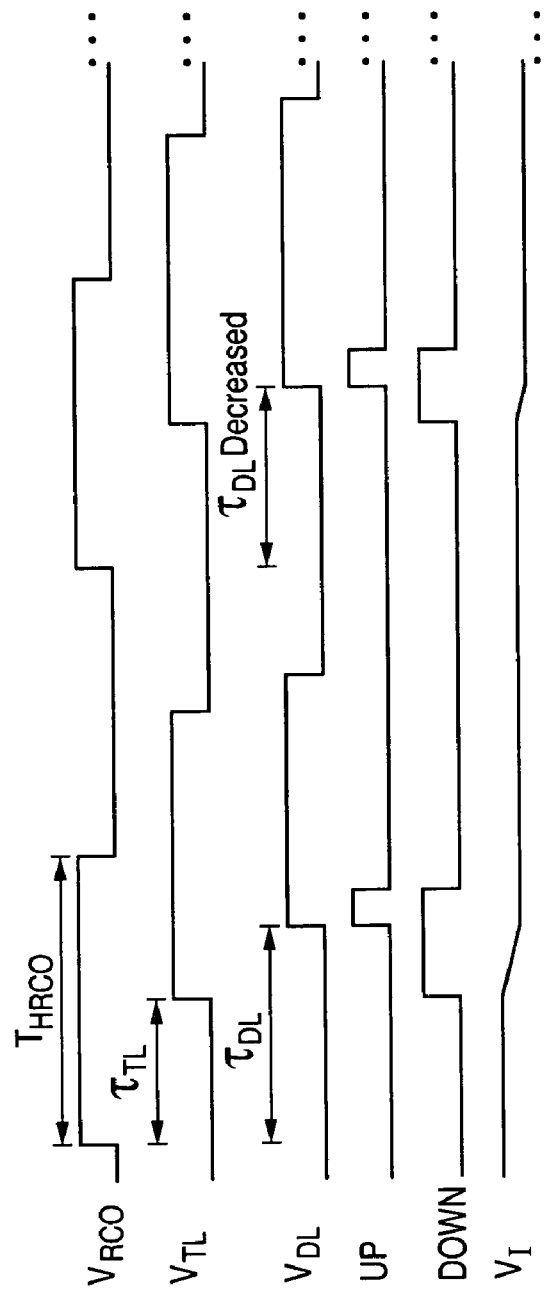

CIRCUITS AND METHODS OF GENERATING AND CONTROLLING SIGNALS ON AN INTEGRATED CIRCUIT

CROSS REFERENCE TO RELATED APPLICATIONS

This invention claims the benefit of priority from U.S. Provisional Application No. 60/663,655, filed Mar. 21, 2005, entitled "Fully Integrated Frequency Generator," the disclosure of which is hereby incorporated herein by reference. This invention is a continuation-in-part of and claims the benefit of priority from U.S. patent application Ser. No. 11/038,560, filed Jan. 19, 2005, entitled "Fully Integrated Frequency Generator," the disclosure of which is hereby incorporated herein by reference. This invention is a continuation-in-part of and claims the benefit of priority from U.S. patent application Ser. No. 11/200,472, filed Aug. 9, 2005, entitled "Circuits and Methods for Reducing Static Phase Offset using Commutating Phase Detectors," the disclosure of which is hereby incorporated herein by reference. This invention is a continuation-in-part of and claims the benefit of priority from U.S. patent application Ser. No. 11/329,779, filed Jan. 11, 2006, entitled "Controlled Delay Line Circuit with Integrated Transmission Line Reference," the disclosure of which is hereby incorporated herein by reference, which claims priority from U.S. Provisional Application No. 60/645,837, filed Jan. 21, 2005, entitled "Controlled Delay Line Circuit with Integrated Transmission Line Reference."

BACKGROUND

The present invention relates to generating and controlling signals on an integrated circuit. One embodiment of the present invention relates to timing circuits, and in particular, to frequency generator circuits and methods that can be fully integrated on a single integrated circuit.

In almost every computer system or digital system, there is a requirement for at least one signal having a specified frequency. One example of such a signal is a reference frequency signal (i.e., a timing reference). For example, a reference frequency signal or timing reference may be a system clock. Signals with specified frequencies, such as a system clock, are created using frequency generators. One example of a frequency generator is a crystal oscillator. A crystal oscillator is an electrical circuit that uses a quartz crystal as a reference device to generate a frequency. Quartz crystals are piezoelectric devices that are made from crystalline silicon dioxide. When quartz crystals are driven by an electrical signal, they will exhibit a mechanical resonance (vibration) at certain frequencies of the driving signal. By using the appropriate electrical circuit, an electrical signal can be generated that is equal in frequency to the quartz crystal's mechanical resonant frequency. Such circuits are advantageous because quartz crystals may be used to generate very precise reference frequency signals.

Even though crystal oscillators have an advantage of being very accurate, they do have some well-known disadvantages. For example, since the creation of the reference frequency involves physically vibrating a silicon dioxide crystal at the reference frequency, over-driving the crystal with too large of an electrical signal can damage it. This damage to the quartz crystal can result in a shift of the resonant frequency, or in extreme cases the crystal can fracture. If a fracture were to occur, the crystal would become non-functional and the crystal oscillator would stop operating at the reference frequency. Sudden large changes in temperature can also damage the quartz crystal. Again, this damage could result in a shift of the crystal's resonant frequency or the fracture of the crystal. Another disadvantage associated with these crystal oscillators are their susceptibility to mechanical vibration or shock. A mechanical shock to the crystal can cause a sudden momentary shift in the oscillator frequency. This occurs because the shock can disturb the mechanical vibration of the quartz crystal. In the same manner, a constant mechanical vibration of the circuit board to which the crystal is attached can interfere with the mechanical vibration of the quartz crystal. A mechanical vibration of the circuit board would cause periodic variations of the output frequency of the crystal oscillator.

A particularly significant drawback to crystal oscillator circuits is that a quartz crystal cannot be integrated into a monolithic integrated circuit together with the electrical drive circuitry. The silicon dioxide crystal is always placed external to the integrated circuit, which contains the electrical devices that drive the crystal. Because the crystal is external to the integrated circuit, the crystal oscillator is much more susceptible to electrical disturbances from external sources. Signals adjacent to the quartz crystal can couple electrical disturbances into the leads of the crystal. These disturbances may result in variations of the output frequency of the oscillator circuit. Having the quartz crystal external to the integrated circuit may also result in the crystal oscillator being more susceptible to humidity and dirt. Accumulated moisture or dirt across the leads of the crystal would create a conduction path between the leads. If the resistance of this parasitic conduction path becomes too low, the crystal oscillator circuit would stop oscillating. Still another drawback to the crystal oscillator is related to economics. Since the quartz crystal is external and separate from the integrated circuit that drives it, additional costs are incurred. One additional cost is due to the extra assembly costs required to attach the external crystal to the printed circuit board. Another additional cost is due to the extra printed circuit board space that is used.

Despite these many disadvantages, crystal oscillators are very popular because they are capable of generating extremely accurate reference frequency signals. The precision of the output frequencies from these crystal oscillator circuits is on the order of 0.01%. However, in many applications such a high level of precision is not required. For example, in many digital systems a precision on the order of 1.0% for the system clock is sufficient.

Thus, there is a need for improved frequency signal generators over existing crystal oscillator techniques. In particular, there is a need for a frequency generator that is fully integrated on a single integrated circuit. The present invention solves these and other problems by providing a frequency generator that can be fully integrated on a single integrated circuit. Features and advantages of the present invention include providing a frequency generator with improved reliability and lower cost.

The present invention also relates to controlled delay lines and delay locked loops, and in particular, to a controlled delay line circuit with an integrated transmission line reference.

One of the most important issues in the design of the digital logic section of an integrated circuit is the system clock to data timing relationship. In order to optimize this important timing relationship, a controlled delay line is often used. The controlled delay line is used to delay the data and/or the system clock in such a way as to improve the timing relationship. For example, one common type of controlled delay line that is often used is a voltage controlled delay line (VCDL). Voltage controlled delay lines are advantageous because the delay time of a VCDL is relatively accurate, predictable, and stable. The accuracy and stability of the voltage controlled delay line depends on how the control voltage for the VCDL is generated. The control voltage is typically created using a reference VCDL within the feedback loop of a Delay Locked Loop (DLL). The DLL forces the reference VCDL to have the same time delay as the timing reference for the DLL. The timing reference for the DLL is usually the period of the system clock or some multiple of this period. Since the system clock is normally oscillating at a very precise and stable frequency, this results in the delay time of the VCDL also being relatively precise and stable.

In some applications, there is a requirement that the digital logic of an integrated circuit has to operate at more than one system clock frequency. If the system clock shifts to a new frequency, the delay time of the VCDL could also change if it is dependent on the period of the system clock. This change in delay time for the VCDL may adversely affect the system clock to data timing relationships. For this design situation, a voltage controlled delay line that is independent of the system clock would be advantageous.

One possible method to create a VCDL that is not dependent on the system clock is to use a resistor and capacitor network as a timing reference device for the Delay Locked Loop. Even though a resistor and capacitor network can be integrated into an integrated circuit, the repeatability and stability of an integrated resistor and capacitor network's RC time constant is poor. An integrated circuit RC time constant can vary quite a lot due to variations in the manufacturing process. For example, such manufacturing process variations may cause the value of an integrated resistor to vary as much as +/−20% and the value of an integrated capacitor can vary as much as +/−10%. These large variations in the values of the integrated resistors and capacitors mean that the precision of an integrated circuit RC time constant is low. Moreover, the value of an integrated resistor can change significantly over a temperature range. The value of an integrated resistor will typically change by 7% over a temperature range of 70 degrees Celsius. Thus, the RC time constant of an integrated circuit resistor and capacitor network is not very stable across a temperature range. Because of the wide changes in value due to manufacturing and temperature variations, an integrated circuit resistor and capacitor network would not make a good timing reference for an integrated DLL.

Thus, there is a need for an improved controlled delay line circuit that is repeatable, stable across manufacturing processes, and independent of the system clock.

The present invention also relates to reducing static phase offset in timing loops, and in particular, to circuits and methods of reducing static phase offset using commutating phase detectors.

Timing loops are feedback loop circuits that are used in a wide variety of electronic applications. Timing loops are typically used to generate signals that have particular frequencies, periods, or delays. Such loops include phase locked loops and delay locked loops, for example. FIG. 1A illustrates a phase locked loop architecture, which is one type of timing loop. Phase locked loop ("PLL") 100A includes a phase detector 110, loop filter 120, voltage controlled oscillator ("VCO") 130, and may optionally include feedback 140 such as a divider, for example. Phase detector 110 includes two input terminals and an output terminal. The first input terminal receives a reference frequency ("REF"), which may be a digital or analog signal. The second input terminal of phase detector 110 is a feedback signal ("FB") coupled to the output of VCO 130. Phase detector 110 translates phase differences between the input signals into an output signal. The output of phase detector 110 may be a current into a capacitance in loop filter 120, for example. The output of loop filter 120 is a voltage that controls the frequency of oscillation of VCO 130. The output frequency generated by VCO 130 may be divided by feedback 140 or coupled directly to the feedback input of phase detector 110.

As mentioned above, timing loops are used in a variety of applications. For example, in the design of computer systems, maintaining adequate timing margin between the computer system's clock signal and data is very important. As the frequency of the system clock increases, maintaining adequate timing margin becomes even more difficult. Thus, the design of clock distribution networks for the computer becomes more and more difficult as frequencies increase. One application of a timing loop is a zero delay buffer ("ZDB"), which is shown in FIG. 1B. In ZDB 100B, the output of the VCO is typically fed back directly to the input of the phase detector. In this example, the phase detector is implemented using a phase frequency detector and a charge pump. A ZDB may be used to improve the performance of the clock distribution network in a computer system. A ZDB may be used to regenerate a clock signal to improve drive capability or to regenerate multiple copies of the system clock. An ideal ZDB has an output that is an identical version of the input signal in phase and frequency (e.g., the divider modulus of the feedback shown in FIG. 1A is equal to one). Since the output signal of an ideal ZDB is exactly in phase with the input signal, there would appear to be no delay in the buffer, hence the name "zero delay buffer." However, in a real application some delay is introduced by non-idealities in the PLL. For example, "static phase offset" is a specification that quantifies the phase difference between the input signal and the output signal. Static phase offset is the average phase offset between the input reference signal received by the PLL and the output of the VCO. In other words, static phase offset is the difference in time between the input and the output signals. Ideally, the static phase offset should be zero seconds for a ZDB. However, in real world applications there is always some phase error between the input and output.

FIG. 1C illustrates another timing loop. Timing loop 100C is a delay locked loop ("DLL") architecture, which is another type of timing loop. An example delay locked loop includes a phase detector 110, filter 120, and voltage controlled delay 150. An input signal to be delayed is coupled to one input of the voltage controlled delay 150, and a second input of the voltage controlled delay is coupled to the output of phase detector 110. The input signal will be delayed by an amount of time set by a voltage at the output of phase detector 110. The input signal to be delayed is also coupled to one input of phase detector 110, and the output of the voltage controlled delay 150 is coupled to the other input of the phase detector 110. In some applications feedback may be included between the output of the voltage controlled delay and the input of phase detector 110. Thus, in the absences of static phase offset error, the output of the controlled delay 150 will be precisely in phase with the input signal when the loop is closed.

Typically, the majority of static phase offset error is generated in the phase detector. For example, referring to FIG. 1A, if the delay between REF input of phase detector 110 to the output of the phase detector is the same as the delay from FB input of phase detector 110 to the output then there should be no static phase offset. Similarly, if the circuitry in the phase detector is matched, then there should be no static phase offset. For example, if the phase detector includes a phase frequency detector and charge pump, then if the pull up and pull down currents in the charge pump are matched, then there should be no static phase offset. However, typically the delays are different and the circuitry is mismatched due to manufacturing variations and imperfections.

Static phase offset is problematic in timing loop designs. In particular, static phase offset in timing applications can severely impact the timing margins, such as computer system clock margins described above. Thus, it would be desirable to reduce static phase offset so that the timing margin in computer system clocks can be improved. Such improved timing margins would allow for greater and more robust system performance.

Thus, there is a need for reducing static phase offset in timing loops. Some embodiments of the present invention solve these and other problems by providing circuits and methods for reducing static phase offset in timing loops using commutating phase detectors.

SUMMARY

The present invention relates to generating and controlling signals on an integrated circuit. In one embodiment, the present invention includes an integrated circuit comprising an integrated transmission line, wherein the integrated transmission line is used as a timing reference for a feedback loop and wherein the feedback loop and the transmission line are integrated on a single integrated circuit. The present invention has a variety of uses. In one embodiment, the present invention may be used as a frequency generator comprising a feedback loop with a transmission line integrated on a single integrated circuit.

In one embodiment, the integrated transmission line comprises one or more conductive interconnect layers.

In one embodiment, the integrated transmission line comprises a plurality of metalization layers arranged in parallel.

In one embodiment, conductive interconnect layers are aluminum or copper.

In one embodiment, the transmission line is stripline or microstrip.

In one embodiment, the feedback loop is a phase locked loop.

In one embodiment, the feedback loop is a delay locked loop.

In one embodiment, the feedback loop includes a controlled delay line.

In one embodiment, the feedback loop includes a phase detector and a filter.

In one embodiment, the present invention includes a frequency generator comprising a phase detector and a voltage controlled oscillator coupled in series, and a transmission line having an input coupled to an output of the voltage controlled oscillator, the transmission line providing a time delay between the transmission line input and a transmission line output, wherein the phase detector includes a first input coupled to the transmission line output and a second input coupled to an output of the voltage controlled oscillator. For example, in one embodiment, the one input of the phase detector may be coupled to the input of the transmission line. The phase detector, voltage controlled oscillator and transmission line are advantageously integrated on a single integrated circuit.

In one embodiment, the frequency generator further comprises pulse removal logic coupled between the voltage controlled oscillator and the transmission line.

In one embodiment, the frequency generator further comprises a lock control circuit.

In one embodiment, the input of the transmission line and the second input of the phase detector are coupled to the same output of the voltage controlled oscillator.

In one embodiment, the input of the transmission line is coupled to a first output of the voltage controlled oscillator and the second input of the phase detector is coupled to a second output of the voltage controlled oscillator.

In one embodiment, the voltage controlled oscillator includes a plurality of outputs having equally spaced phases.

In one embodiment, the phase detector comprises a phase frequency detector and a charge pump.

In another embodiment, the present invention includes a method of generating an electronic signal comprising delaying a first signal by a first delay in an integrated transmission line to produce a first delayed signal, and coupling the first delayed signal in a feedback loop with at least one other signal, wherein the integrated transmission line is used as a timing reference for the feedback loop, and wherein the feedback loop and the transmission line are integrated on a single integrated circuit.

In one embodiment, the at least one other signal is generated at an output of a voltage controlled oscillator.

In one embodiment, the method further comprises detecting a phase difference between the first delayed signal and said at least one other signal, and in accordance therewith, changing a voltage at an input of the voltage controlled oscillator so that the period of an output signal at an output of the voltage controlled oscillator is equal to the first delay.

In one embodiment, the first signal is coupled to a first output of the voltage controlled oscillator, and wherein said at least one other signal is generated at a second output of the voltage controlled oscillator.

In one embodiment, the method further comprises detecting a phase difference between the first delayed signal and said at least one other signal, and in accordance therewith, changing a voltage at an input of the voltage controlled oscillator so that a phase difference between a first voltage controlled oscillator output signal and a second voltage controlled oscillator output signal is equal to said first delay.

In one embodiment, the feedback loop is used to control one or more controlled delays, and wherein said at least one other signal is generated by one of said one or more controlled delays.

In another embodiment, the present invention includes a controlled delay line circuit comprising a feedback loop including an integrated transmission line, wherein the integrated transmission line is used as a timing reference for the feedback loop and wherein the feedback loop and the transmission line are integrated on a single integrated circuit. The feedback loop may be a Delay Locked Loop, for example.

In one embodiment, the present invention includes an integrated circuit comprising a first controlled delay line coupled in a feedback loop and an integrated transmission line, and the integrated transmission line is used as a timing reference for the feedback loop and wherein the feedback loop and the transmission line are integrated on a single integrated circuit.

In one embodiment, the feedback loop includes a phase detector having a first input coupled to an output of the integrated transmission line and a second input coupled to an output of the first controlled delay line.

In one embodiment, the first controlled delay line and the integrated transmission line have inputs that are coupled to a circuit that generates a first periodic signal.

In one embodiment, the circuit further comprises a phase-frequency detector having a first input coupled to an output of the integrated transmission line and a second input coupled to an output of the first controlled delay line, a charge pump coupled to an output of the phase-frequency detector, and a capacitor coupled to the output of the charge pump and to a control input of the first controlled delay line.

In one embodiment, the circuit further comprise a second controlled delay line having a control input coupled to the control input of the first controlled delay line.

In one embodiment, the second controlled delay line receives an input signal, and generates a delayed version of said input signal.

In one embodiment, the present invention includes an integrated circuit comprising an integrated transmission line having an input coupled to receive a periodic signal, the transmission line delaying the periodic signal by a first delay to produce a first delayed signal, a first controlled delay line having a first input coupled to the periodic signal and a first control input, the first controlled delay line delaying the periodic signal by a first variable delay to produce a second delayed signal, a phase detector having a first input coupled to an output of the integrated transmission line and a second input coupled to an output of the first controlled delay line, and a filter coupled between an output of the phase detector and the control input of the first controlled delay line.

In one embodiment, the phase detector, the first controlled delay line, and the transmission line are integrated on a single integrated circuit.

In one embodiment, wherein the filter comprises a capacitor.

In one embodiment, the circuit further comprises a second controlled delay line having a control input coupled to the filter.

In one embodiment, the phase detector is a phase-frequency detector coupled to a charge pump.

In one embodiment, the periodic signal is generated by an oscillator circuit, and the phase-frequency detector includes an enable input coupled to the oscillator circuit.

In one embodiment, the present invention includes a method of controlling the delay of a signal comprising generating a first signal, delaying the first signal by a first delay in an integrated transmission line to produce a first delayed signal, and delaying the first signal by a first variable delay in a first controlled delay line to produce a second delayed signal, wherein the first controlled delay line is configured in a feedback loop, wherein the integrated transmission line is used as a timing reference for the feedback loop to adjust the first variable delay to be equal to the first delay, and wherein the feedback loop and the transmission line are integrated on a single integrated circuit.

In one embodiment, the method further comprises delaying a second signal by a second variable delay in a second controlled delay line.

In one embodiment, the second variable delay is equal to the first variable delay.

In one embodiment, the method further comprises detecting a phase difference between the first delayed signal and the second delayed signal.

In one embodiment, the method further comprises increasing the first variable delay if the first delay is greater than the first variable delay, and decreasing the first variable delay if the first delay is smaller than the first variable delay.

In one embodiment, a time difference between the first delayed signal and the second delayed signal is translated into a voltage on a capacitor and used to control the first variable delay.

In one embodiment, the method further comprises generating a first pulse in response to the first delayed signal and generating a second pulse in response to the second delayed signal, discharging a current from a capacitor in response to receiving the first pulse, and charging a current into a capacitor in response to receiving the second pulse, and in accordance therewith, changing a first voltage on the capacitor, and adjusting the first variable delay using the first voltage on the capacitor.

In one embodiment, the present invention includes an integrated circuit comprising transmission line means for delaying a periodic reference signal means by a fixed amount of time, controlled delay line means for delaying the periodic reference signal means by a first variable amount of time, and feedback loop means for adjusting the first variable amount of time to equal the fixed amount of time, wherein the transmission line means, the controlled delay line means, and the feedback loop means are integrated on a single integrated circuit.

Embodiments of the present invention may also reduce static phase offset in timing loops. In one embodiment, the present invention includes a timing loop comprising first and second phase detectors, wherein during a first time period, the first phase detector is coupled in a closed timing loop and the second phase detector is decoupled from the closed timing loop and calibrated, and during a second time period, the second phase detector is coupled in a closed timing loop and the first phase detector is decoupled from the closed timing loop and calibrated.

In one embodiment, when the first or second phase detector is calibrated, first and second inputs of the phase detector being calibrated are coupled to a common input signal.

In one embodiment, when the first or second phase detector is calibrated, at least one output of the phase detector being calibrated is coupled to a mismatch detector for detecting mismatches in the phase detector.

In one embodiment, when the first or second phase detector is calibrated, at least one output of the phase detector being calibrated is coupled to a mismatch detector for detecting a voltage drift at the output of the phase detector that is indicative of the mismatches in the phase detector.

In one embodiment, the first phase detector includes a first input, a second input, an adjust input, and an output, the second phase detector includes a first input, a second input, an adjust input, and an output, a voltage controlled oscillator having an input coupled to the output of the first phase detector and the output of the second phase detector, and an output coupled to the second input of the first phase detector and the second input of the second phase detector, and a mismatch detector having one or more inputs coupled to the output of the first phase detector and the output of the second phase detector, and one or more outputs coupled to the adjust input of the first phase detector and the adjust input of the second phase detector, wherein during the first time period, the output of the first phase detector is coupled to the voltage controlled oscillator, the first and second inputs of the second phase detector are coupled to a common input signal, and the output of the second phase detector is coupled to the mismatch detector, and in accordance therewith, the mismatch detector generates a correction signal for adjusting the second phase detector, and during a second time period, the output of the second phase detector is coupled to the voltage controlled oscillator, the first and second inputs of the first phase detector are coupled to a common input signal, and the output of the first phase detector is coupled to the mismatch detector, and in accordance therewith, the mismatch detector generates a correction signal for adjusting the first phase detector.

In one embodiment the first phase detector includes a first input, a second input, an adjust input, and an output, the second phase detector includes a first input, a second input, an adjust input, and an output, a voltage controlled delay having a first input coupled to the output of the first phase detector and the output of the second phase detector, a second input coupled to an input signal to be delayed, and an output coupled to the second input of the first phase detector and the second input of the second phase detector, and a mismatch detector having one or more inputs coupled to the output of the first phase detector and the output of the second phase detector, and one or more outputs coupled to the adjust input of the first phase detector and the adjust input of the second phase detector, wherein during the first time period, the output of the first phase detector is coupled to the voltage controlled delay, the first and second inputs of the second phase detector are coupled to a common input signal, and the output of the second phase detector is coupled to the mismatch detector, and in accordance therewith, the mismatch detector generates a correction signal for adjusting the second phase detector, and during a second time period, the output of the second phase detector is coupled to the voltage controlled delay, the first and second inputs of the first phase detector are coupled to a common input signal, and the output of the first phase detector is coupled to the mismatch detector, and in accordance therewith, the mismatch detector generates a correction signal for adjusting the first phase detector.

In one embodiment, the first and second phase detectors each comprise a phase frequency detector and a charge pump.

In one embodiment, the first and second phase detectors each further include an adjust input, wherein the adjust input of the first phase detector adjusts at least a first current in a first charge pump, and the adjust input of the second phase detector adjusts at least a second current in the second charge pump.

In one embodiment, the timing loop further comprises a first calibration capacitor coupled to the first phase detector during the second time period, and a second calibration capacitor coupled to the second phase detector during the first time period.

In one embodiment, the timing loop further comprises a window comparator coupled to an output of the second phase detector during the first time period and coupled to an output of the first phase detector during the second time period.

In one embodiment, the timing loop further comprises a current pulse generator coupled to an output of the window comparator.

In one embodiment, the timing loop further comprises a phase detector configuration controller.

In one embodiment, the phase detector configuration controller comprises a counter.

In one embodiment, the phase detector configuration controller further comprises a phase frequency detector.

In one embodiment, the timing loop is a phase locked loop or a delay locked loop.

In one embodiment, the timing loop is configured as a zero delay buffer.

In another embodiment, the present invention includes a timing loop comprising first and second phase detectors alternately configured in a correction loop and a closed timing loop, wherein during a first time period, the first phase detector is configured in the closed timing loop and the second phase detector is configured in the correction loop, and during a second time period, the second phase detector is configured in the closed timing loop and the first phase detector is configured in the correction loop.

In one embodiment, first and second inputs of the second phase detector are coupled to a common input signal during the first time period, and first and second inputs of the first phase detector are coupled to a common input signal during the second time period.

In one embodiment, the first and second phase detectors each comprise a phase frequency detector and a charge pump.

In one embodiment, the correction loop detects mismatch in the first and second phase detectors and generates a correction signal, wherein the correction signal is coupled to an adjust input of the first phase detector to adjust a first current in a first charge pump during the second time period, and the correction signal is coupled to an adjust input of the second phase detector to adjust a second current in a second charge pump during the first time period.

In one embodiment, the correction loop comprises a first calibration capacitor coupled to the first phase detector during the second time period and a second calibration capacitor coupled to the second phase detector during the first time period.

In one embodiment, the correction loop comprises a window comparator.

In one embodiment, the correction loop further comprises a current pulse generator.

In one embodiment, the timing loop further comprises a counter for controlling the duration of the first and second time periods.

In one embodiment, the timing loop further comprises a phase frequency detector coupled to an input of the counter.

In one embodiment, the timing loop is a phase locked loop or a delay locked loop.

In one embodiment, the timing loop is configured as a zero delay buffer.

In another embodiment, the present invention includes a method comprising, during a first time period, configuring a first phase detector to control a timing loop and calibrating a second phase detector, and during a second time period, configuring the second phase detector to control the timing loop and calibrating the first phase detector.

In one embodiment, first and second inputs of the second phase detector are coupled to a common input signal during the first time period, and first and second inputs of the first phase detector are coupled to a common input signal during the second time period.

In one embodiment, the timing loop is a phase locked loop or a delay locked loop.

In one embodiment, the timing loop is configured as a zero delay buffer.

In one embodiment, during the first time period calibrating comprises detecting mismatches in the second phase detector, and during the second time period calibrating comprises detecting mismatches in the first phase detector.

In one embodiment, during the first time period calibrating comprises detecting a voltage drift at the output of the second phase detector, and during the second time period calibrating comprises detecting a voltage drift at the output of the first phase detector.

In one embodiment, during the first time period calibrating further comprises comparing the voltage drift at the output of the second phase detector to at least one reference voltage, and during the second time period calibrating further comprises comparing the voltage drift at the output of the first phase detector to at least one reference voltage.

In one embodiment, the first phase detector comprises a first phase frequency detector and a first charge pump, and the second phase detector comprises a second phase frequency detector and a second charge pump.

In one embodiment, during the first time period calibrating further comprises adjusting a voltage on a gate of a first transistor coupled to one or both of a current source or current sink in the second charge pump, and during the second time period calibrating further comprises adjusting a voltage on a gate of a second transistor coupled to one or both of a current source or current sink in the first charge pump.

In yet another embodiment, the present invention includes a method comprising, during a first time period, configuring a first phase detector to control a timing loop, detecting a first mismatch in the second phase detector, and reducing the first mismatch generated by the second phase detector, during a second time period, configuring the second phase detector in a timing loop, detecting a second mismatch in the first phase detector, and reducing the second mismatch generated by the first phase detector.

In one embodiment, first and second inputs of the second phase detector are coupled to a common input signal during the first time period, and first and second inputs of the first phase detector are coupled to a common input signal during the second time period.

In one embodiment, reducing includes adjusting the amount of current generated at an output of the first or second phase detectors to reduce the first or second mismatch.

In one embodiment, the first phase detector comprises a first phase frequency detector and a first charge pump, and the second phase detector comprises a second phase frequency detector and a second charge pump.

In one embodiment, during the first time period, reducing comprises adjusting a voltage on a gate of a first transistor coupled to one or both of a current source or current sink in the second charge pump, and during the second time period reducing comprises adjusting a voltage on a gate of a second transistor coupled to one or both of a current source or current sink in the first charge pump.

In one embodiment, during the first time period, detecting comprises comparing a voltage drift at an output of the second phase detector to at least one reference voltage, and during the second time period detecting comprises comparing a voltage drift at an output of the first phase detector to at least one reference voltage.

The following detailed description and accompanying drawings provide a better understanding of the nature and advantages of the present invention.

BRIEF DESCRIPTION OF THE DRAWINGS

FIG. 14 is a timing diagram to illustrate the operation of a controlled delay line according to one embodiment of the present invention.
FIG. 15 is another timing diagram to illustrate the operation of a controlled delay line according to one embodiment of the present invention.

DETAILED DESCRIPTION

Described herein are techniques for generating and controlling timing signals on an integrated circuit. Circuits and methods are disclosed for generating reference frequencies and controlled delays on an integrated circuit. The present disclosure also includes circuits and methods that may be used to implement phase detection, which may be used to improve the accuracy of the frequency generation and delay controls disclosed herein. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 2:
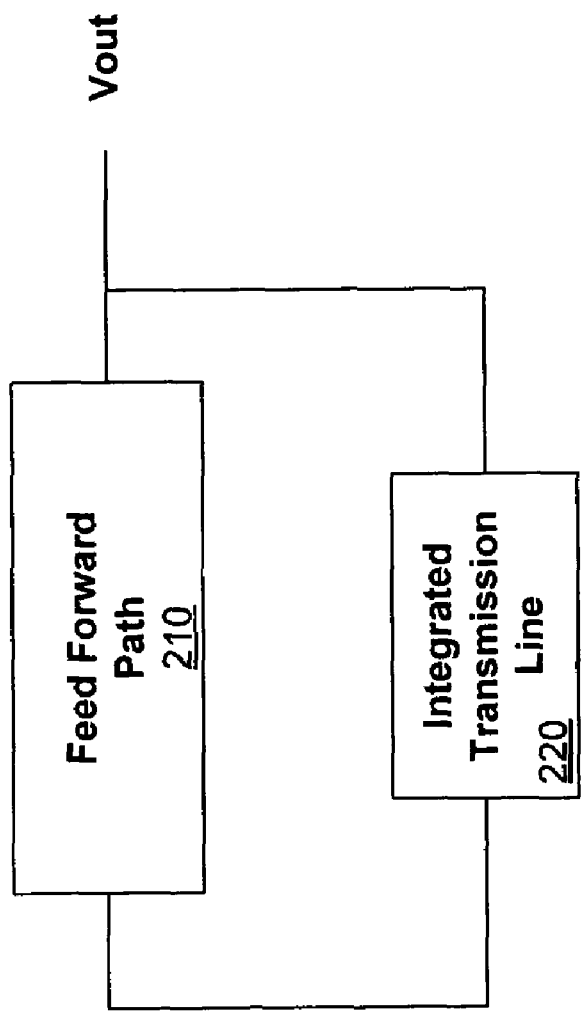
FIG. 2 illustrates an integrated circuit according to one embodiment of the present invention.

FIG. 2 illustrates an integrated circuit 200 according to one embodiment of the present invention. Integrated circuit 200 includes a feedback loop comprising a feed forward path 210 and an integrated transmission line 220. The circuitry for the feed forward path 210, integrated transmission line 220 and any other application specific circuitry are integrated on a single integrated circuit. Embodiments of the present invention use the integrated transmission line 220 as a timing reference for the feedback loop. Thus, integrated circuit 200 may be used in a variety of applications that require a timing reference, such as a frequency generator or controlled delay, for example.

Circuits used in timing applications, such as frequency generator circuits or delay lines, require some form of reference device to set the time base of the signals (i.e., a timing reference or frequency reference). A good reference device should be accurate, repeatable, and predictable. Moreover, such devices should be stable with temperature changes and power supply voltage changes. Developing a good timing or frequency reference device that can be integrated into an integrated circuit is extremely difficult. A quartz crystal, for example, cannot be built into an integrated circuit, but rather, must reside external to the integrated circuit that drives it. Typically, in an integrated circuit the RC time constant of a resistor and capacitor network has been used as a timing reference. Resistors and capacitors can be built into an integrated circuit, but an integrated circuit RC time constant can exhibit unacceptable variations due to variations in the manufacturing process. For example, the value of an integrated resistor can vary as much as +/−20%, and the value of an integrated capacitor can vary as much as +/−10% because of variations in the manufacturing process. Thus, the time constant of an integrated resistor and capacitor network is not very repeatable. Moreover, the value of an integrated resistor can change significantly over a temperature range. The value of an integrated resistor will typically change by 7% over a temperature range of 70 degrees Celsius. Therefore, the RC time constant of an integrated circuit resistor and capacitor network is not stable with temperature. Because of the wide changes in value due to manufacturing and temperature variations, an integrated circuit resistor and capacitor network does not make a good timing reference device.

Embodiments of the present invention include building an integrated transmission line (ITL) into an integrated circuit as the timing reference device. The flight time delay of the transmission line may be used as a timing reference for a feedback loop in a frequency generator, phase locked loop, or delay locked loop, for example, that is integrated on the same chip. Time delay in a transmission line is caused by the propagation of electromagnetic waves down the transmission line. Such time delays may further include some delay caused by parasitic resistances of the delay line. Embodiments of the present invention may preferably minimize the delay effects of parasitic resistances because such resistances may cause the time delay of an integrated transmission line to vary across process and temperature. More generally, the flight time delay of a transmission line depends on a variety of parameters, including geometric shape, length, construction, and the relative dielectric constant of the transmission line's insulator. One common transmission line is stripline. The flight time delay for a stripline transmission line can be calculated from the following equation:

$$\tau_{TL} = (L_{TL}(\epsilon_r)^{1/2})/c_o$$

where, $\tau_{TL}$=flight time delay of the transmission line
$L_{TL}$=length of the transmission line
$\epsilon_r$=relative dielectric constant of the transmission line insulator.
$c_o$=the speed of light in a vacuum.

These equations apply to transmission lines with fields contained in a single dielectric. Examples of such transmission lines include stripline and coax. However, these equations are illustrative only. The present invention may use any integrated transmission line that produces a stable time delay, such as microstrip, for example, and others.

Stability and repeatability advantages of using an integrated transmission line in a frequency generator can be seen by examining the terms of the flight time delay equation. The length of the integrated transmission line, $L_{TL}$, may be set by design choice. Once the value of the term $L_{TL}$ is designed, an integrated transmission line will have negligible changes in length due to variations in the manufacturing of the integrated circuit.

With regard to the other parameters effecting flight time delay, the term $c_o$ is the speed of light in a vacuum, which is a physical constant that is invariable. The value of the term $\epsilon_r$ depends on the dielectric material used as the insulator for the integrated transmission line. In the current manufacturing environment, the most common insulator for a transmission line on an integrated circuit would be amorphous silicon dioxide. The relative dielectric constant, $\epsilon_r$, for silicon dioxide does not change with manufacturing variations and exhibits only a very small variation due to temperature changes. The temperature coefficient for silicon dioxide's relative dielectric constant is approximately 20 ppm/° C. The variation of $\epsilon_r$ due to temperature change translates into a temperature coefficient for $\tau_{TL}$ of approximately 10 ppm/° C. For a 70° C. change in temperature, the total variation of $\tau_{TL}$ should be less than 0.1% due to the variation in $\epsilon_r$.

Another advantage of an integrated transmission line is that the time delay of an integrated transmission line is not dependent on the magnitude of the signal that is propagating along the transmission line. Thus, the time delay, $\tau_{TL}$, is independent of the power supply voltage of the integrated circuit. Therefore, because the flight time delay of a transmission line is independent of the power supply voltage, exhibits very good stability versus temperature change, and changes very little due to manufacturing variations, the flight time delay of an integrated transmission line would make a good timing reference for an integrated feedback loop, such as a phase locked loop or DLL. For example, using the integrated transmission line as a timing reference, it is possible to create a frequency generator that has a total frequency variation of less than +/−1.0%. This total variation would include all of the variations due to manufacturing, temperature, and power supply voltage. Therefore, embodiments of the present invention advantageously include both a transmission line (to act as a timing reference) and other frequency generator circuitry on the same integrated circuit. Additionally, some embodiments of the present invention advantageously include a controlled delay line with an integrated transmission line as the timing reference.

In some embodiments, the present invention may use one or more conductive interconnect layers (e.g., metalization) for constructing an integrated circuit transmission line. For example, connecting multiple metalization layers in parallel can reduce the resistance of the integrated transmission line, resulting in an improved transmission line. One common metalization material is aluminum. Additionally, other processes may use one or more copper metalizations as the transmission line. Since copper has a lower sheet resistance than aluminum, the use of copper for the integrated transmission line can reduce its resistance even more. Of course, other conductive materials could be used. Furthermore, embodiments of the present invention may use very high speed transistor devices. These fast devices allow the designer to create on-chip high-speed components included in a frequency generator or voltage controlled delay, for example, using an integrated transmission line as a timing reference device.

Embodiments of the present invention include a fully integrated frequency generator that uses a feedback loop to force a voltage controlled oscillator (VCO) to have a period equal to the time delay of an integrated transmission line. The integrated transmission line (ITL) resides on the same monolithic silicon die along with other circuitry contained within each of the functional blocks of the frequency generator. Embodiments of the invention include a frequency generator that is totally integrated and uses no external devices such as a quartz crystal as a reference device. The integrated transmission line may be used as the timing reference device for the frequency generator. The frequency generator may be used to generate a digital system clock, for example.

Figure 3:
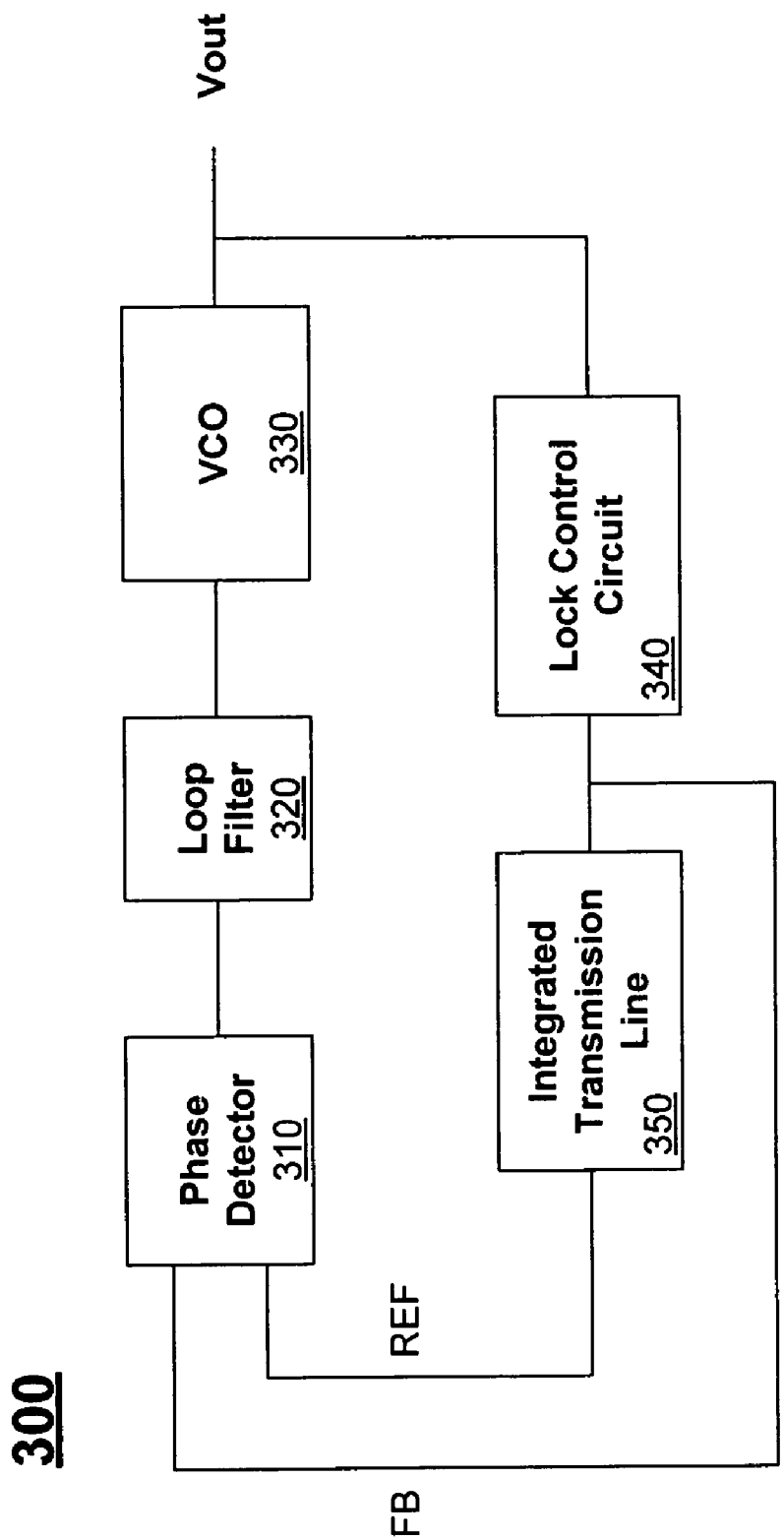
FIG. 3 illustrates a frequency generator according to another embodiment of the present invention.

FIG. 3 illustrates a frequency generator according to one embodiment of the present invention. Frequency generator 300 includes a feed forward path of a feedback loop comprising a phase detector ("PD") 310, loop filter 320 and voltage controlled oscillator ("VCO") 330 coupled in series. PD 310 may detect the phase difference of two input signals REF and FB. In some specific embodiments, PD 310 may include a charge pump (not shown) for translating phase differences between REF and FB into currents that are received by loop filter 320 and translated into a voltage. In one embodiment, a phase detector used in a feedback loop may be implemented using the techniques described below and in U.S. patent application Ser. No. 11/200,472 filed on Aug. 9, 2004, entitled "Circuits and Methods for Reducing Static Phase Offset using Commutating Phase Detectors," naming Paul William Ronald Self as Inventor. The output of the PD 310 is coupled to the input of VCO 330 through loop filter 320, which may be a resistor and capacitor connected in series, for example. VCO 330 generates a signal, $V_{OUT}$, having a frequency, $F_{OUT}$, that is dependent on the voltage received from filter 320. The output of the VCO may be the output of the system, which may be used as a reference signal such as a system clock, or which may be used to generate yet other signals at other frequencies.

The output of the VCO is also provided through a feedback path of the feedback loop to the two inputs of PD 310. The feedback path includes an integrated transmission line 350 for introducing a delay that acts as the timing reference for the frequency generator. The delay caused by the integrated transmission line is referred to herein synonymously as "time delay" and "flight time delay." For instance, the signal at the VCO output may be delayed by a predetermined amount of time as it passes through integrated transmission line 350. The delayed VCO output signal is then received at one input of PD 310. An undelayed version of the VCO output signal is provided to the other input of PD 310. Thus, PD 310 receives both delayed and undelayed versions of the VCO output through the feedback path. The action of the loop will cause the period of the VCO output signal to be the same as the delay caused by integrated transmission line 350.

Embodiments of the present invention may also include lock control circuit 340. To achieve desired performance, frequency generator 300 should operate so that the period of the VCO output signal, Tvco (i.e., $1/F_{OUT}$, where Fout is the frequency of the VCO output signal), is equal to the value of the integrated transmission line's flight time delay, $\tau_{TL}$. Some embodiments of the invention may include a lock control circuit 340 to help eliminate any ambiguity as to what value the period of $V_{OUT}$ will be locked. Lock control circuit 340 acts as a lock acquisition aid for the system so that the VCO output signal has a period equal to the time delay of the integrated transmission line. For example, lock control circuit 340 may ensure that the phase detector is locking to appropriate edges of the feedback signals REF and FB. Without lock control circuit 340, Tvco could lock to a value that is equal to $\tau_{TL}$ divided by an integer. That is, instead of locking to a value equal to $\tau_{TL}$, $T_{VCO}$ could lock to a value equal to $\tau_{TL}/2$ or $\tau_{TL}/3$ or $\tau_{TL}/4$ etc. Lock control circuit 340 guarantees that PD 310 will only compare two successive rising edges of $V_{OUT}$. Without lock control circuit 340, the loop could potentially enter a locked condition where PD 310 is comparing two non-successive rising edges of $V_{OUT}$. If the loop enters a stable state where PD 310 is comparing non-succesive edges from the VCO, this would mean that Tvco would be locked to a value equal to $\tau_{TL}/2$ or $\tau_{TL}/3$ or $\tau_{TL}/4$ etc. By introducing lock control circuit 340 in the loop, only successive rising edges will be compared by PD 310, and $T_{VCO}$ will be forced to only equal $\tau_{TL}$. In this example, lock control circuit 340 is between VCO 330 and integrated transmission line 350. However, lock control circuit 340 may be located at a variety of positions in the circuit and may further include connections to control the operation of other loop blocks.

Figure 4:
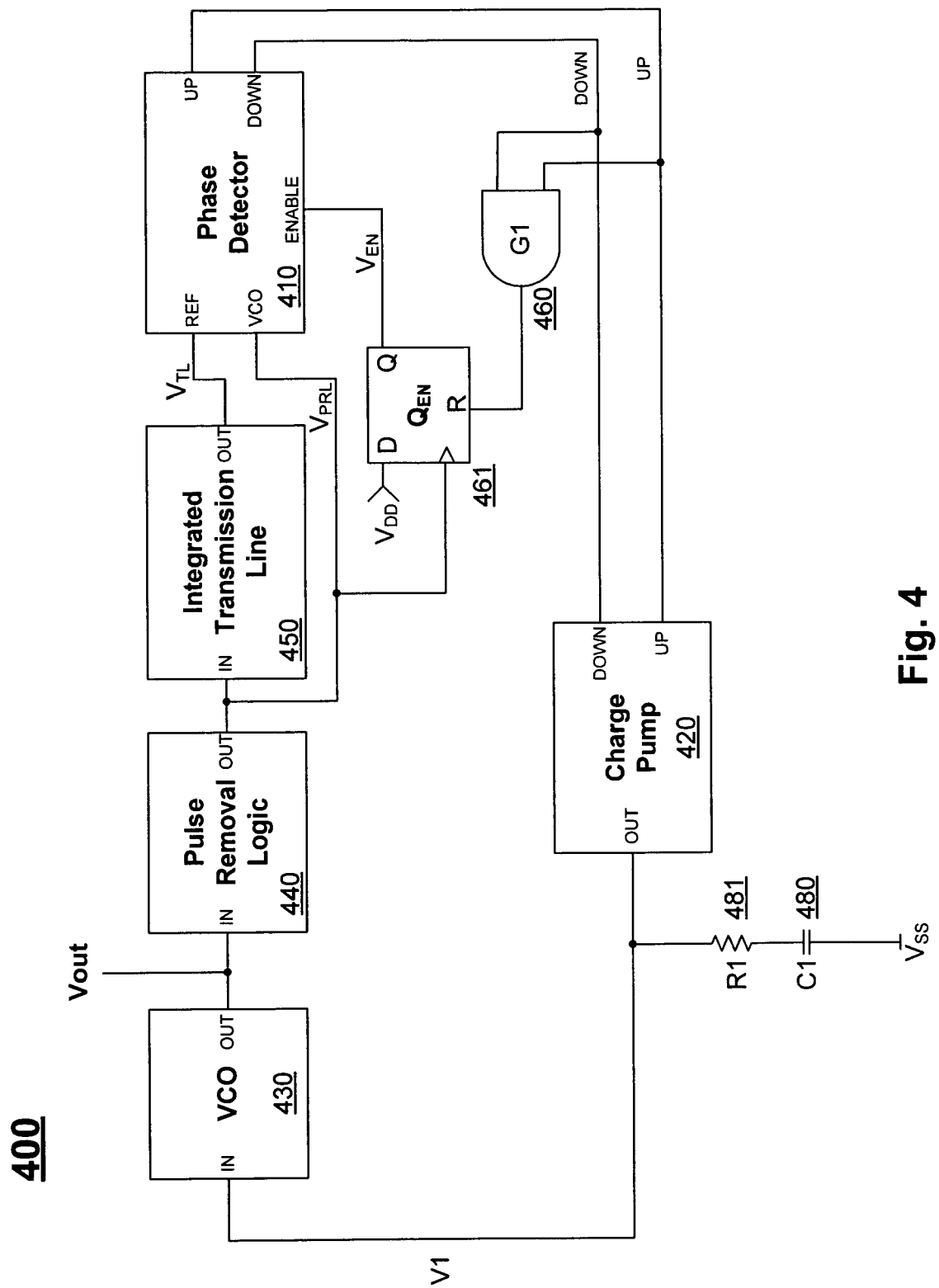
FIG. 4 illustrates a frequency generator according to another embodiment of the present invention.

FIG. 4 illustrates a frequency generator according to another embodiment of the present invention. Frequency generator 400 includes a voltage controlled oscillator ("VCO") 430, a phase detector 410, a charge pump 420, an integrating capacitor ("$C_1$") 480 and zero resistor ("$R_1$") 481, pulse removal logic 440, integrated transmission line 450 and an enable control circuit including AND gate 460 and D-type flip flop ("DFF") 461. Integrated transmission line 450 introduces a delay in the feedback path for controlling the frequency of the VCO output signal. Pulse removal logic 440 and enable control circuits 460-461 are the lock control circuits for this example. These circuits eliminate ambiguity as to what value the period of $V_{OUT}$ will be locked. The operation of frequency generator 400 may be referred to as either phase locked loop ("PLL") operation, because it includes a phase detector and VCO, or as delay locked loop ("DLL") operation because it forces the period of the voltage controlled oscillator to be equal to the flight time delay of the integrated transmission line.

Figure 5:
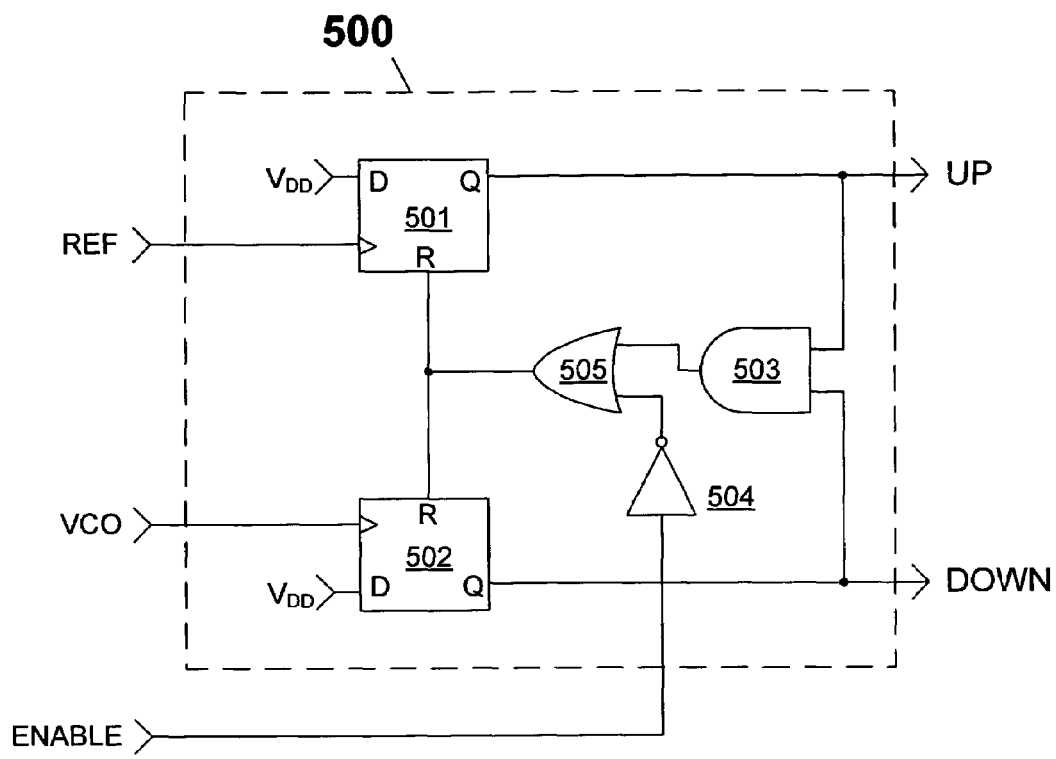
FIG. 5 is an example of a phase detector according to one embodiment of the present invention.

FIG. 5 is an example of a phase detector according to one embodiment of the present invention. Phase detector 500 includes two D-type flip flops 501 and 502 ("DFF"), AND gate 503, inverter 504 and OR gate 505. In this example, AND gate 503, inverter 504 and OR gate 505 provide both enable and self-reset functions for phase detector 500. DFF 501 is initialized into a logic low state (e.g., Vss or ground) and receives signal REF as a clock input, which in frequency generator 400 is the output of the integrated transmission line 450 (i.e., the delayed VCO output signal). The D-input is connected to power supply Vdd. Thus, when the phase detector receives the delayed signal, the Q-output switches from low to high. Similarly, DFF 502 receives signal VCO as a clock input, which in frequency generator 400 is the output of the pulse removal logic 440 (i.e., the undelayed VCO output signal). The D-input of DFF 502 is also connected to power supply Vdd. Thus, when the phase detector receives the undelayed signal, the Q-output switches from low to high. Regardless of whether REF or VCO is received first, the circuit is reset to low logic state when both outputs are high using AND gate 503, which has inputs connected to the Q-outputs of DFFs 501 and 502 and an output coupled to the reset terminal of each DFF 501 and 502 through OR gate 505. Phase detector 500 also includes an ENABLE input. When the ENABLE input is in a high logic state (e.g., Vdd), the output of inverter 504 is logic low and phase detector 500 is enabled. However, when the ENABLE input is in a low logic state, then the output of inverter 504 is high and phase detector 500 is disabled because the reset is held high. A high logic level for reset forces the Q outputs of the DFFs 501 and 502 to logic low levels.

Figure 6:
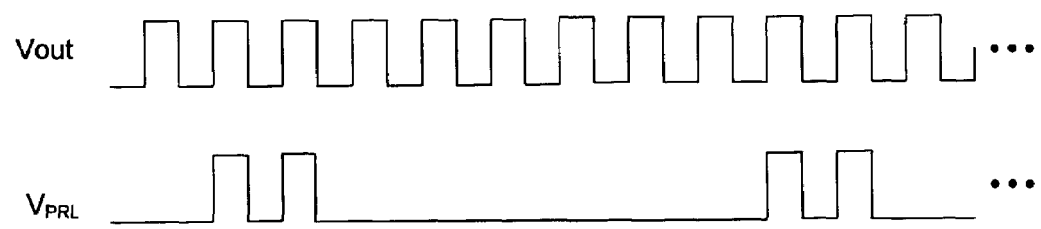
FIG. 6 is an example waveform to illustrate pulse removal according to one embodiment of the present invention.
Figure 7:
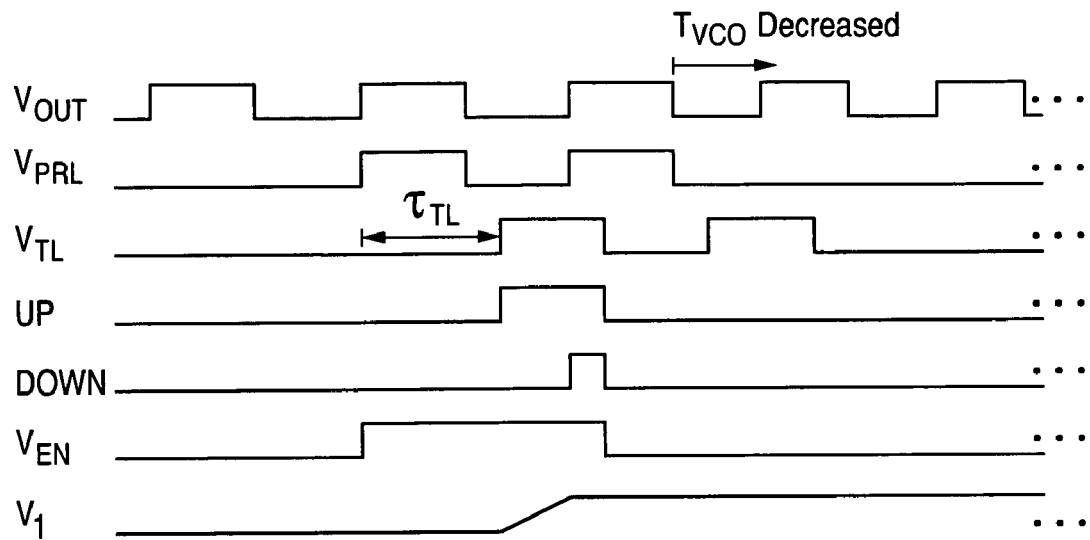
FIG. 7 is a timing diagram to illustrate the operation of a frequency generator according to one embodiment of the present invention.
Figure 8:
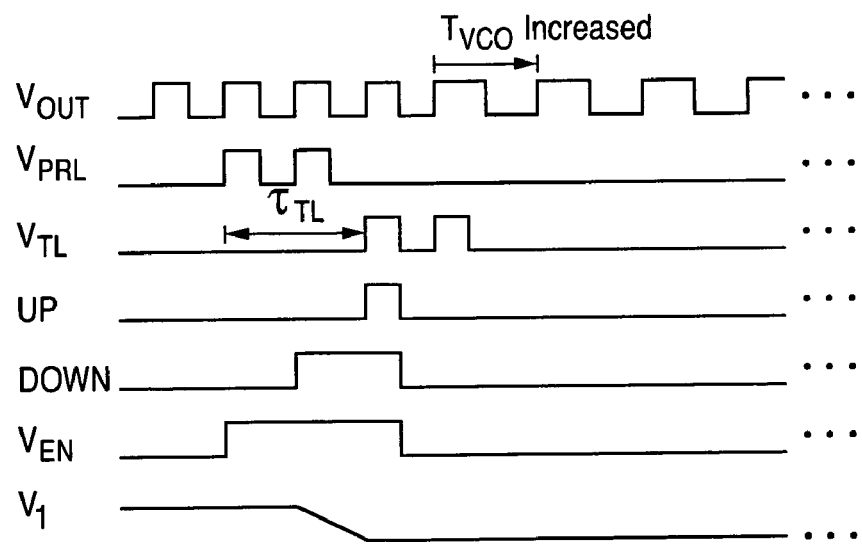
FIG. 8 is another timing diagram to illustrate the operation of a frequency generator according to one embodiment of the present invention.

The operation of frequency generator 400 using the example phase detector 500 can be understood by referring to timing diagrams found in FIGS. 6-8. FIG. 6 is an example waveform to illustrate pulse removal according to one embodiment of the present invention. The timing diagram of FIG. 6 shows the operation of the pulse removal logic ("PRL") 440. PRL 440 removes pulses from the signal $V_{OUT}$, which is the output of the VCO 430. In the example shown in FIG. 6, $V_{PRL}$ is generated by deleting 75% of the $V_{OUT}$ pulses. Depending on the requirements for the loop, a higher percentage or a lower percentage of the pulses could be removed. In one embodiment, at least a majority of the pulses are removed. The percentage of pulses removed may range from 50% to a little less than 100%. PRL 440, together with the enable control circuits 460 and 461 and the ENABLE function of the phase detector ("PD") 410 are included in the loop in order to eliminate any ambiguity as to what value the period of $V_{OUT}$ will be locked to. To achieve desired performance, frequency generator 400 should operate so that the period of the VCO output signal, Tvco, is equal to the value of the integrated transmission line's flight time delay, $\tau_{TL}$. Without pulse removal logic 440, Tvco could lock to a value that is equal to $\tau_{TL}$ divided by an integer. That is, instead of locking to a value equal to $\tau_{TL}$, $T_{VCO}$ could lock to a value equal to $\tau_{TL}/2$ or $\tau_{TL}/3$ or $\tau_{TL}/4$, etc. PRL 440 and the ENABLE input of PD 410 guarantee that PD 410 will only compare two successive rising edges of $V_{OUT}$. Without PRL 440 and the PD ENABLE, the loop could potentially enter a locked condition where PD 410 is comparing two non-successive rising edges of $V_{OUT}$. If the loop enters a stable state where PD 410 is comparing non-successive edges from the VCO, this would mean that Tvco would be locked to a value equal to $\tau_{TL}/2$ or $\tau_{TL}/3$ or $\tau_{TL}/4$, etc. Thus, some embodiments of the present invention may include PRL 440 and an ENABLE function in PD 410, or other lock control circuitry, so that $T_{VCO}$ will be forced to equal $\tau_{TL}$.

FIG. 7 is a timing diagram to illustrate the operation of a frequency generator according to one embodiment of the present invention. The timing diagram found in FIG. 7 illustrates the behavior of the circuit when $T_{VCO}$ is too long (i.e., $F_{OUT}$ is too low). As is shown in FIG. 7 the output of PRL 440, $V_{PRL}$, contains pulses that have the same pulse width as those of its input, which is the output of VCO 430, $V_{OUT}$. However, the number of pulses in $V_{PRL}$ is reduced from the number found in $V_{OUT}$. $V_{TL}$ is a delayed version of $V_{PRL}$ with a time delay equal to $\tau_{TL}$. Initially, $V_{PRL}$, $V_{TL}$, $V_{EN}$, UP and DOWN are all logic low. With $V_{EN}$ being low, the ENABLE function of the PD is de-asserted which forces the PD outputs, UP and DOWN, to logic low states. The first rising edge of $V_{PRL}$ clocks the D-flip flop $Q_{EN}$ 461, which results in $V_{EN}$ going to a logic high state. When $V_{EN}$ goes high, PD ENABLE becomes asserted which means that the outputs of the PD are allowed to change states as a function of the PD inputs, VCO and REF. Because of the propagation delay of the D-flip flop $Q_{EN}$, the PD ENABLE is not asserted for the first rising edge of $V_{PRL}$, and therefore, the PD does not respond to the first rising edge of $V_{PRL}$. In this example, the period of $V_{OUT}$, Tvco, and thus the period of $V_{PRL}$, is longer than $\tau_{TL}$. Since $\tau_{TL}$ is shorter than Tvco, the first rising edge that the PD responds to comes from $V_{TL}$. The rising edge of $V_{TL}$ causes the UP output of the PD to go to a logic high. An UP signal going high before the DOWN signal goes high indicates that the frequency of the VCO needs to increase (i.e., $T_{VCO}$ needs to decrease). A high logic level for the UP input of the charge pump ("CP") 420 causes the CP to turn on a charging current source (not shown), which charges the capacitor ("$C_1$") 480. The CP charging current into $C_1$ results in a voltage ramp in the positive direction for $V_1$, thereby increasing the frequency of Vout (i.e., decreasing the period $T_{VCO}$). The decrease in Tvco is shown in the timing diagram of FIG. 7. The end result is that the feedback loop causes Tvco to move in a direction to bring it closer in value to $\tau_{TL}$, which is the time delay of the integrated transmission line.

When $V_{PRL}$ goes high the second time, the PD responds by forcing the DOWN output signal high. For a short amount of time both PD outputs, UP and DOWN, are at logic highs simultaneously. When DOWN goes to a logic high, the CP will turn on a discharging current source (not shown). Thus, while the UP and DOWN signals are both high, current sources in the charge pump are charging and discharging capacitor ("$C_1$") 480 simultaneously. In one embodiment the charge pump current sources are equal in value, and therefore, when the DOWN signal goes high the charging of $C_1$ ends and the positive voltage ramp of $V_1$ stops. When both PD outputs (i.e., UP and DOWN) are logic high, DFFs 501 and 502 in the PD are reset through AND gate 503 and OR gate 505, causing both PD outputs to go logic low simultaneously. When both PD outputs are logic high, AND gate 460 is also activated. Thus, AND gate 460 generates a signal that resets D-flip flop $Q_{EN}$, which results in $V_{EN}$ going to a logic low.

FIG. 8 is another timing diagram to illustrate the operation of a frequency generator according to one embodiment of the present invention. The timing diagram of FIG. 8 illustrates the behavior of the invention when $T_{VCO}$ is too short (i.e. the $F_{OUT}$ is too high). Initially, $V_{PRL}$, $V_{TL}$, $V_{EN}$, UP and DOWN are all logic low. The first rising edge of $V_{PRL}$ clocks D-flip flop $Q_{EN}$ which results in $V_{EN}$ going to a logic high. When $V_{EN}$ goes high, PD ENABLE becomes asserted, which means that the outputs of the PD are allowed to change states as a function of the PD inputs, VCO and REF. As was previously explained, because of the propagation delay of the D-flip flop $Q_{EN}$, the PD ENABLE is not asserted for the first rising edge of $V_{PRL}$. Therefore, the PD does not respond to the first rising edge of $V_{PRL}$. Since $T_{VCO}$ is shorter than $\tau_{TL}$, the PD responds first to the second rising edge of $V_{PRL}$. When the second rising edge of $V_{PRL}$ occurs, the DOWN output of the PD goes to a logic high. A DOWN signal going high before the UP signal goes high indicates that the frequency of the VCO needs to decrease (i.e., $T_{VCO}$ needs to increase). A high logic level for the DOWN input of CP 420 causes the CP to turn on a discharge current source. The discharging current source results in charge being removed from $C_1$ and also results in a negative going voltage ramp for $V_1$. When the first rising edge of $V_{TL}$ occurs, the PD responds by forcing the UP output to a high logic level. When the UP input of the CP goes to a high logic level, the CP turns on a charging current source. At this point both the charging and discharging current sources on the output of the CP are turned on. Because the current sources are of equal value, the discharge of $C_1$ ends and the negative going voltage ramp of $V_1$ stops. For a short amount of time both the UP signal and DOWN signal are at logic highs simultaneously, and then the PD resets itself which results in both PD outputs (UP and DOWN) going to logic lows simultaneously. At the same time that the PD resets itself, AND gate 460 generates a signal that resets D-flip flop $Q_{EN}$, causing $V_{EN}$ to go to a logic low. A low $V_{EN}$ de-asserts the ENABLE function of the PD. The lower voltage of $V_1$ causes the period of the VCO to increase (i.e., the frequency of the VCO decreases). This increase in Tvco is shown in the timing diagram of FIG. 8. Again, the result is that the feedback loop has caused Tvco to move in a direction to bring it closer in value to $\tau_{TL}$.

In the manner described in the previous paragraphs, the loop will gradually adjust $V_1$ and the period of the VCO until the value of $T_{VCO}$ matches the flight time delay of the integrated transmission line. Thus, one can see that an integrated transmission line can be used as a timing reference for a completely integrated oscillator rather than using an external device such as a quartz crystal as a reference.

Figure 9:
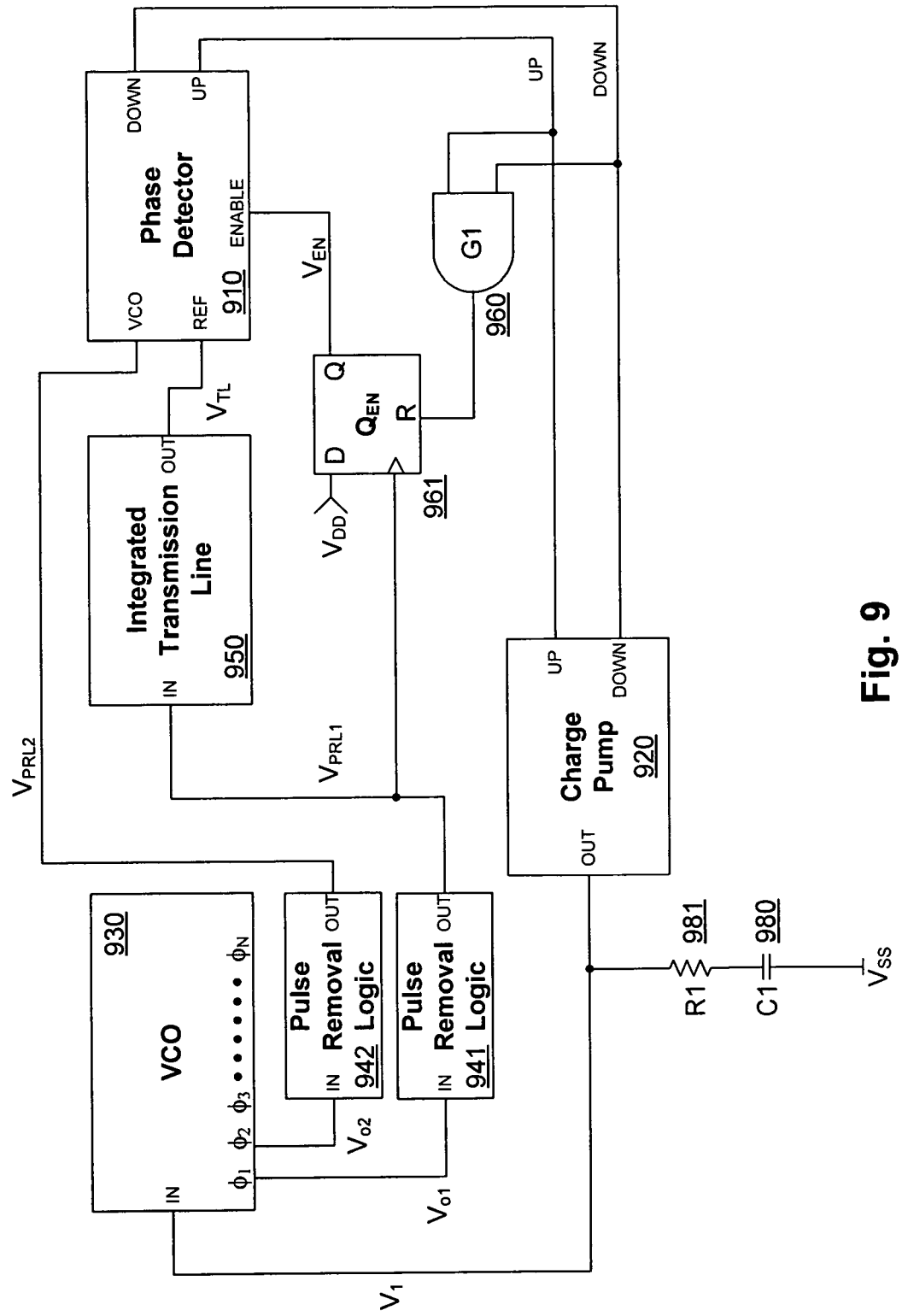
FIG. 9 illustrates a frequency generator according to another embodiment of the present invention.

Frequency generators may be implemented in other ways using an integrated circuit feedback loop with an integrated transmission line. FIG. 9 illustrates a frequency generator 900 according to another embodiment of the present invention. As shown in FIG. 9, a voltage controlled oscillator (VCO) can be designed to have more than one output phase. For example, a VCO may be designed to have N equally spaced output phases (e.g., $\phi_1, \phi_2, \phi_3, \ldots, \phi_N$, where N is an integer representing the Nth VCO output phase). In this embodiment, the frequency of the VCO may be set by using the feedback loop to control the time difference (i.e., phase difference) between any two of the VCO's output phases. The relationship between the frequency of the VCO and the time difference between two adjacent output phases is shown below.

$$F_{VCO}=1/T_{VCO}=1/N\tau_D$$

Where, $F_{VCO}$ is the frequency of the VCO, $T_{VCO}$ is the period of the VCO, $\tau_D$ is the magnitude of the time difference between two adjacent VCO output phases and N is the number of equally spaced VCO output phases.

In the example circuit shown in FIG. 9, the time difference between two adjacent output phases (e.g., $\phi_1, \phi_2$) are controlled by the loop. However, it is to be understood that it is possible to set the frequency of the VCO by controlling the time difference between any two output phases (e.g., $\phi_L, \phi_M$, where L and M are any two of the VCO output phases). Thus, FIG. 9 is a frequency generator that uses a feedback loop to force two adjacent output phases of a VCO to be equal to the flight time delay of an integrated transmission line 950. Frequency generator 900 includes a phase detector 910, charge pump 920, loop filter (e.g., capacitor 980 and resistor 981), VCO 930 and integrated transmission line 950 configured in a feedback loop. In this example, the circuit further includes a lock control circuit comprising two pulse removal logic ("PRL") circuits 941 and 942. Therefore, in this example, VCO 930 provides two outputs $V_{o1}$ (e.g., $\phi_1$) and $V_{o2}$ (e.g., $\phi_2$), which are coupled to the input of each PRL circuit. The input of PRL 941 receives $V_{o1}$ (e.g., $\phi_1$), and the output of PRL 941 (i.e., signal "$V_{PRL1}$") is coupled to the input of integrated transmission line 950 and the clock input of D flip-flop 961. Similarly, the input of PRL 942 receives $V_{o2}$ (e.g., $\phi_2$), and the output of PRL 942 (i.e., signal "$V_{PRL2}$") is coupled to the input of phase detector 910.

Generally, the embodiment in FIG. 9 is another example of an integrated circuit with a feedback loop that contains an integrated transmission line that is used as a timing reference. The integrated transmission line resides on the same monolithic silicon die along with all the circuitry contained within each of the functional blocks shown in FIG. 9. One example implementation of the phase detector (PD) was previously shown in FIG. 5. An example operation of the Pulse Removal Logic (PRL) was previously shown in FIG. 6. Each PRL 941 and 942 removes pulses from the corresponding VCO output phase to which it is connected. The purpose and operation of a PRL block was previously explained.

Figure 10:
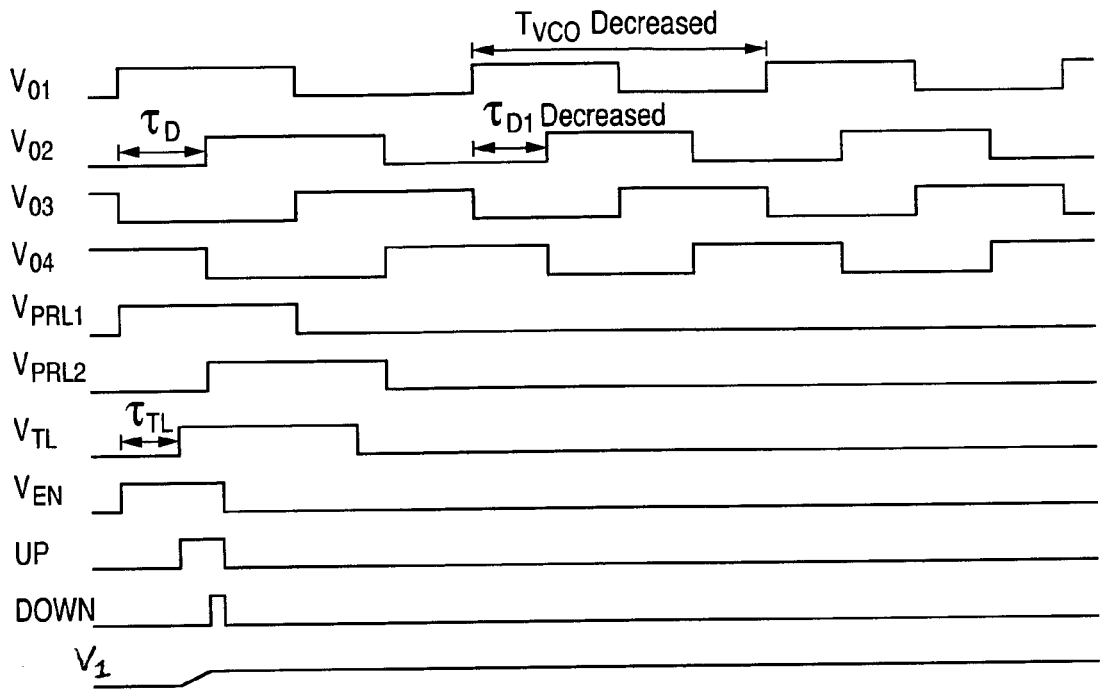
FIG. 10 is a timing diagram to illustrate the operation of the frequency generator of FIG. 9 according to one embodiment of the present invention.
Figure 11:
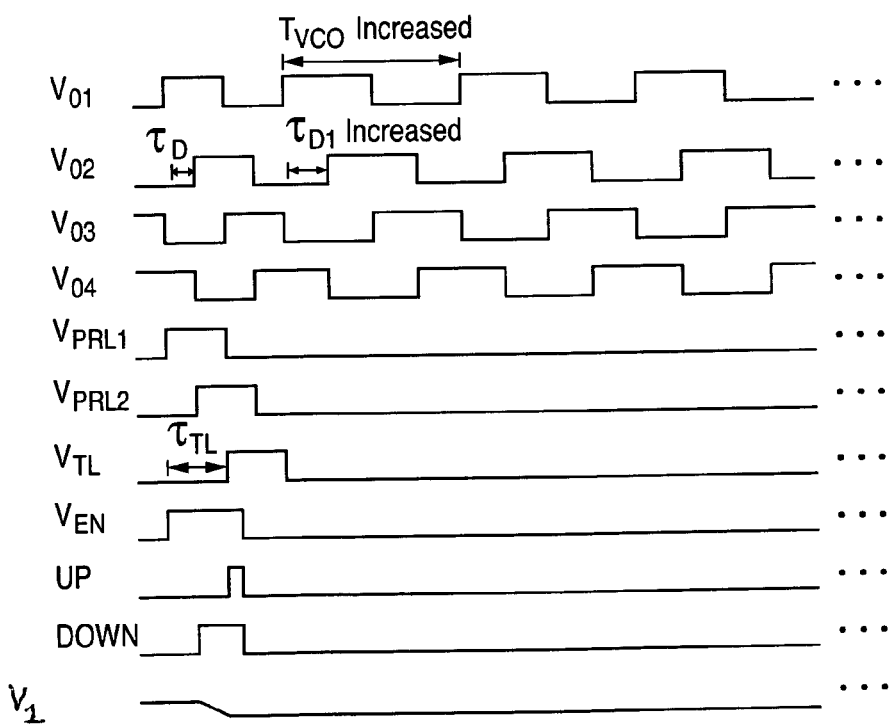
FIG. 11 is another timing diagram to illustrate the operation of the frequency generator of FIG. 9 according to one embodiment of the present invention.

The timing diagrams in FIGS. 10 and 11 illustrate how the embodiment of FIG. 9 uses a feedback loop to force $\tau_D$ to equal the flight time delay of the integrated transmission line, $\tau_{TL}$. For the examples found in FIGS. 10 and 11, the VCO is assumed to have 4 equally spaced output phases (N=4) producing signals $V_{o1}, V_{o2}, V_{o3}$ and $V_{o4}$. However, it should be noted that the same principle of operation applies for any number, N, of VCO output phases.

FIG. 10 is a timing diagram to illustrate the operation of the frequency generator of FIG. 9 according to one embodiment of the present invention. The timing diagram found in FIG. 10 illustrates the behavior of the circuit when $\tau_D$ and $T_{VCO}$ are too long (i.e., $F_{OUT}$ is too low). As is shown in FIG. 10 the outputs of the PRL 941 and 942, $V_{PRL1}$ and $V_{PRL2}$, contain pulses that have the same pulse width as those of their inputs, $V_{o1}$ and $V_{o2}$. However, the number of pulses in $V_{PRL1}$ and $V_{PRL2}$ is reduced from the number found in $V_{o1}$ and $V_{o2}$. $V_{TL}$ is a delayed version of $V_{PRL1}$ with a time delay equal to flight time delay of the integrated transmission line, $\tau_{TL}$. Initially, $V_{PRL1}, V_{PRL2}, V_{TL}, V_{EN}$, UP and DOWN are all logic low. With $V_{EN}$ being low, the ENABLE function of the PD is de-asserted, which forces the PD outputs, UP and DOWN, to logic low states. The first rising edge of $V_{PRL1}$ clocks the D-flop $Q_{EN}$, which results in $V_{EN}$ going to a logic high state. When $V_{EN}$ goes high, PD ENABLE becomes asserted, which means that the outputs of the PD are allowed to change states as a function of the PD inputs, VCO and REF. Since $\tau_D$ is longer than $\tau_{TL}$, the first rising edge that the PD responds to comes from $V_{TL}$. The rising edge of $V_{TL}$ causes the UP output of the PD to go to a logic high. An UP signal going high before the DOWN signal goes high indicates that the frequency of the VCO needs to increase (i.e., $\tau_D$ and $T_{VCO}$ need to decrease). A high logic level for the UP input of the Charge Pump (CP) causes the CP to turn on a charging current source (not shown) connected to its output. The current source charges the capacitor 980 ("$C_1$") which results in a voltage ramp in the positive direction for $V_1$. When $V_{PRL2}$ goes high, the PD responds by forcing the DOWN output signal high. For a short amount of time both PD outputs, UP and DOWN, are at logic highs simultaneously. When DOWN goes to a logic high, the CP will turn on a discharging current source (not shown) that is connected to its output. While the UP and DOWN signals are both high, the Charge Pump's charging and discharging current sources are on simultaneously. In one embodiment, the charging and discharging current sources are equal in value, and thus, the charging of $C_1$ ends and the positive voltage ramp of $V_1$ stops. At this point the PD resets itself which results in both PD outputs, UP and DOWN, going to logic lows simultaneously. At the same time that the PD resets itself, AND gate 960 ("G1") generates a signal that resets D-flop 961 ("$Q_{EN}$"), which results in $V_{EN}$ going to a logic low. A low $V_{EN}$ de-asserts the ENABLE function of the PD. The higher voltage of $V_1$ causes $\tau_D$ and $T_{VCO}$ to decrease (i.e., the frequency of the VCO increases). This decrease in $\tau_D$ and Tvco is shown in the timing diagram of FIG. 10. The end result is that the feedback loop of the invention has caused $\tau_D$ to move in a direction to bring it closer in value to the flight time delay of the integrated transmission line, $\tau_{TL}$.

FIG. 11 is another timing diagram to illustrate the operation of the frequency generator of FIG. 9 according to one embodiment of the present invention. The timing diagram of FIG. 11 illustrates the behavior of the circuit when $\tau_D$ and $T_{VCO}$ are too short (i.e. $F_{OUT}$ is too high). Just like the previous example initially, $V_{PRL1}$, $V_{PRL2}$, $V_{TL}$, $V_{EN}$, UP and DOWN are all logic low. The first rising edge of $V_{PRL1}$ clocks D-flop $Q_{EN}$, which results in $V_{EN}$ going to a logic high. When $V_{EN}$ goes high, PD ENABLE becomes asserted, which means that the outputs of the PD are allowed to change states as a function of the PD inputs, VCO and REF. Since $\tau_D$ is shorter than $\tau_{TL}$, the PD responds first to the rising edge of $V_{PRL2}$. When the rising edge of $V_{PRL2}$ occurs, the DOWN output of the PD goes to a logic high. A DOWN signal going high before the UP signal goes high indicates that the frequency of the VCO needs to decrease (i.e., $\tau_D$ and $T_{VCO}$ need to increase). A high logic level for the DOWN input of the Charge Pump (CP) causes the CP to turn on a discharge current source that is connected to its output. The discharging current source results in charge being removed from $C_1$ and also results in a negative going voltage ramp for $V_1$. When the first rising edge of $V_{TL}$ occurs, the PD responds by forcing the UP output to a high logic level. When the UP input of the CP goes to a high logic level, the CP turns on a charging current source that is connected to its output. At this point both the charging and discharging current sources on the output of the CP are turned on. In one embodiment, the charging and discharging current sources are equal in value, and thus, the discharge of $C_1$ ends and the negative going voltage ramp of $V_1$ stops. For a short amount of time both the UP signal and DOWN signal are at logic highs simultaneously and then the PD resets itself which results in both PD outputs, UP and DOWN, going to logic lows simultaneously. At the same time that the PD resets itself, AND Gate G1 generates a signal which resets D-flop $Q_{EN}$ causing $V_{EN}$ to go to a logic low. A low $V_{EN}$ de-asserts the ENABLE function of the PD. The lower voltage of $V_1$ causes $\tau_D$ and $T_{VCO}$ to increase (i.e., the frequency of the VCO decreases). This increase in $\tau_D$ and Tvco is shown in the timing diagram of FIG. 11. Again, the result is that the feedback loop of the invention has caused $\tau_D$ to move in a direction to bring it closer in value to the flight time delay of the integrated transmission line.

In the manner described in the previous two paragraphs, the feedback loop will gradually adjust $V_1$ and the frequency of the VCO until the value of $\tau_D$ matches the flight time delay of the integrated transmission line.

Figure 12A:
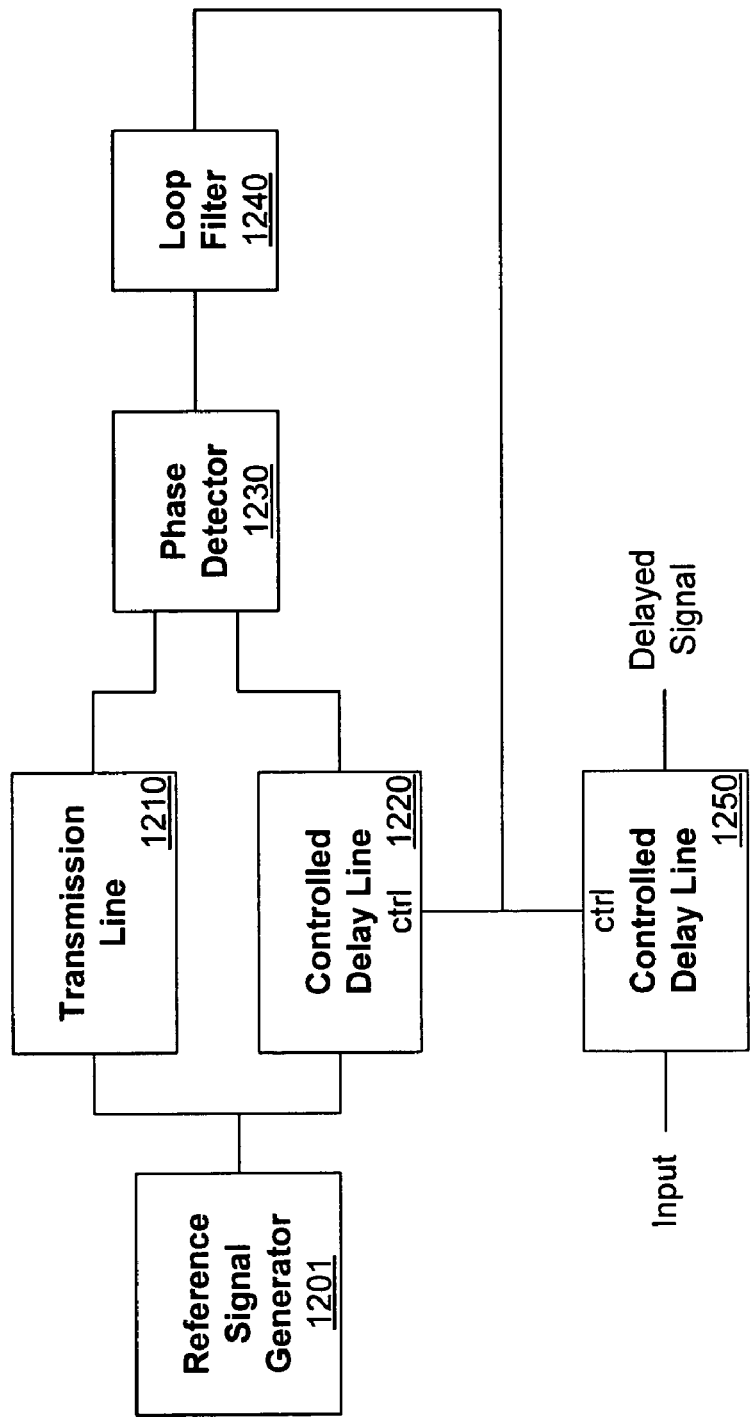
FIG. 12A illustrates an integrated transmission line used as a timing reference in a feedback loop according to another embodiment of the present invention.

FIG. 12A illustrates an integrated transmission line used as a timing reference in a feedback loop according to one embodiment of the present invention. In one embodiment, the present invention includes an integrated circuit feedback loop comprising a first controlled delay line 1220 and a transmission line 1210, where the transmission line is used as a timing reference for the feedback loop. In one embodiment, the feedback loop and the transmission line are integrated on a single integrated circuit. The feedback loop may further include a phase detector 1230 and loop filter 1240. Phase detector 1230 includes a first input coupled to an output of transmission line 1210 and a second input coupled to an output of controlled delay line 1220. The output of phase detector 1230 is coupled to loop filter 1240. The loop filter may include a capacitor, for example. The output of loop filter 1240 is used to control the delay of controlled delay line 1220.

In one embodiment, a reference signal generator 1201 may be used to generate a reference signal, which may be a periodic signal such as a square wave, for example. The reference signal is provided to the inputs of transmission line 1210 and controlled delay line 1220. Transmission line 1210 delays the reference signal by a certain delay dependent on the characteristics of the transmission line. The controlled delay line 1220 delays the reference signal by a delay that is a function of the signal received on the control input ("ctrl"). Phase detector 1230 receives a first delayed signal from the transmission line and a second delayed signal from the controlled delay line. Phase detector 1230 may be used to detect a phase difference between the two delayed signals. The output of phase detector 1230 may be filtered in loop filter 1240, and the output of loop filter 1240, which may represent the difference in delay between transmission line 1210 and controlled delay line 1220, may be coupled to the control input of controlled delay line 1220. Thus, the loop increases the delay of the controlled delay line if the transmission line delay is greater than the delay of the controlled delay line. Similarly, the loop decreases the delay of the controlled delay line if the transmission line delay is less than the delay of the controlled delay line. The action of the feedback loop will cause the delay of the controlled delay line 1220 to be equal to the delay of the transmission line 1210. The control signal generated by the loop filter, which is used to control the delay line 1220, may also be used to control the delay of one or more other delay lines 1250. The other delay lines may receive input signals, such as digital data signals or system clocks, for example, and delay the input signals by an amount of time that is related to the delay of controlled delay line 1220.

Figure 12B:
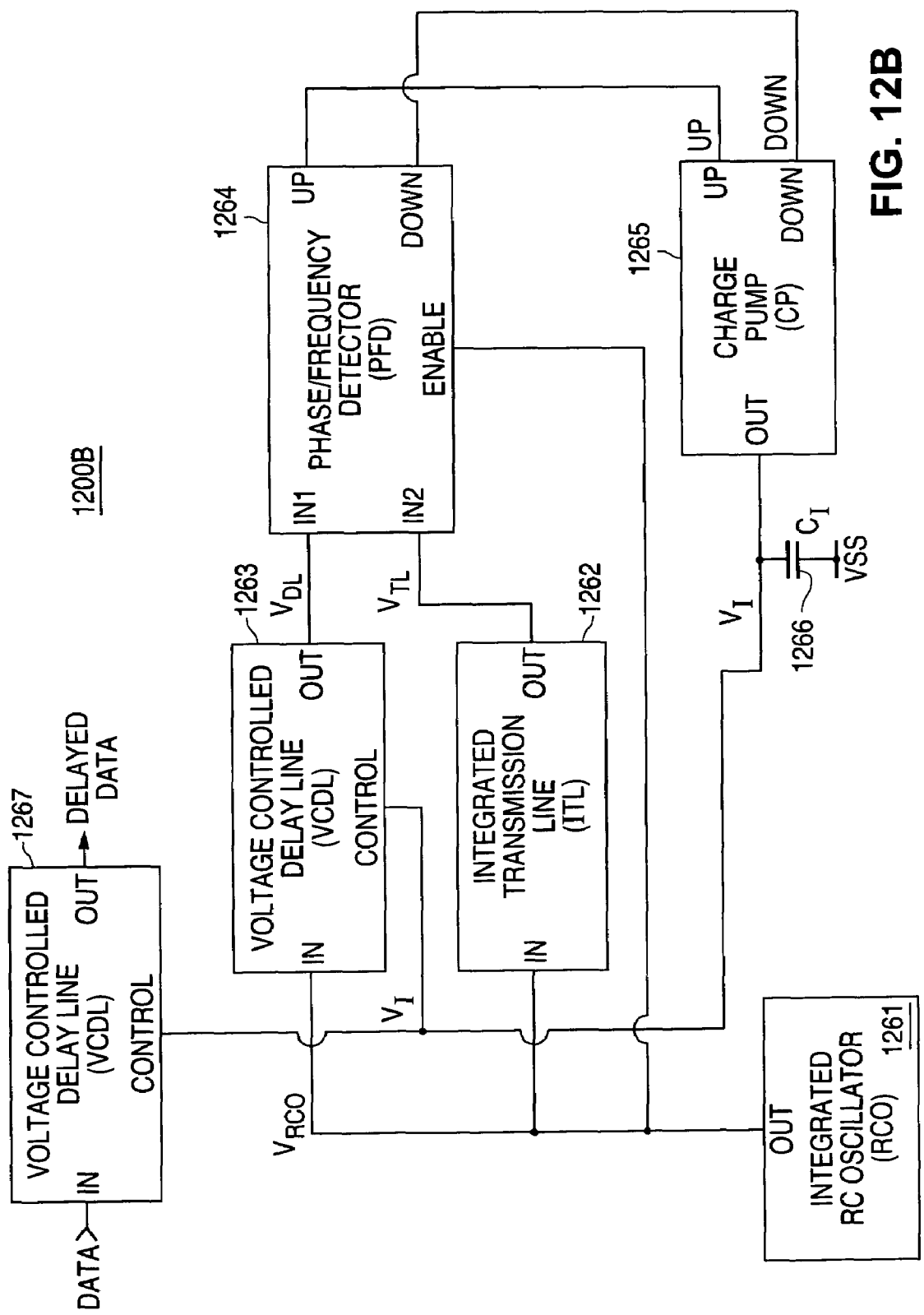
FIG. 12B illustrates a controlled delay line with an integrated transmission line reference according to one embodiment of the present invention.

FIG. 12B illustrates a controlled delay line circuit with an integrated transmission line reference according to one embodiment of the present invention. In one embodiment, the present invention includes an integrated circuit that uses a feedback loop to force a controlled delay line to have a time delay that is equal to the flight time delay of the integrated transmission line (ITL). While the example in FIG. 12B is described using a voltage controlled delay line, it is to be understood that a variety of different implementations of a controlled delay line may be used, including current controlled delay lines and digital controlled delay lines (i.e., a digital delay line, such as series connected inverters and a multiplexer, for example).

Figure 13:
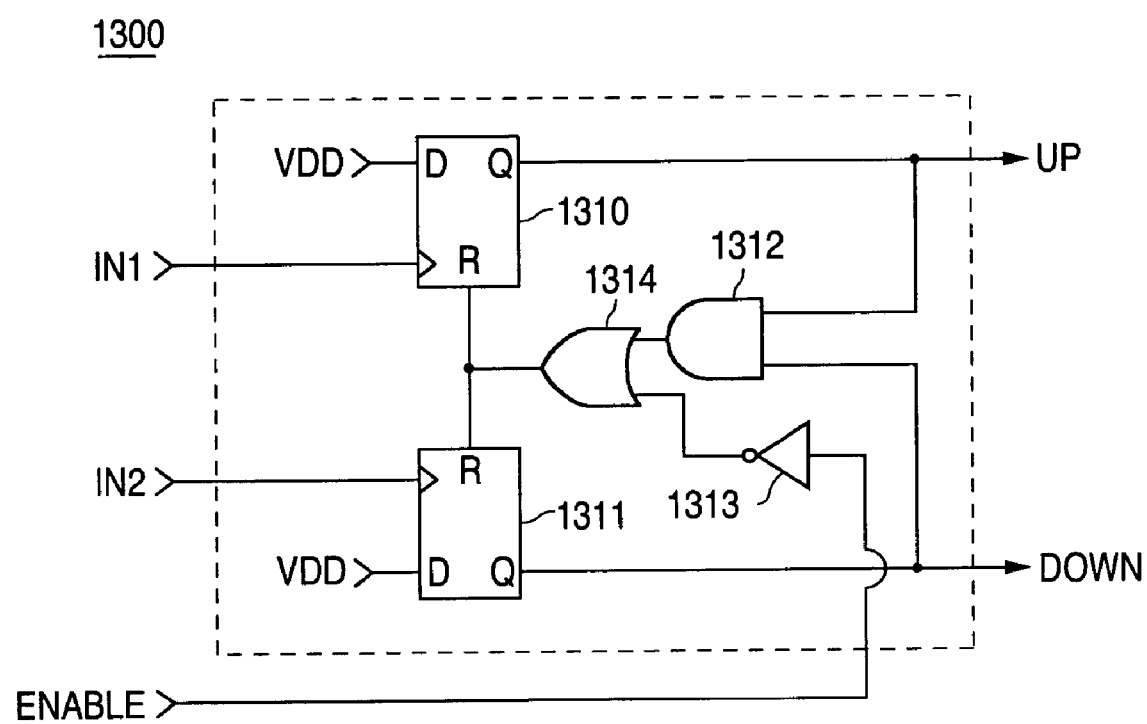
FIG. 13 is an example of a phase detector that may be used in the circuit of FIG. 12B according to one embodiment of the present invention.

Controlled delay line circuit 1200B includes an RC oscillator 1261 coupled to a reference voltage controlled delay line 1263 and an integrated transmission line 1262. The reference voltage controlled delay line 1263 is included in a feedback loop. In this example, the feedback loop also includes a phase detector 1264, a charge pump 1265, and a capacitor 1266 ("$C_1$"). The voltage on $C_1$ (i.e., $V_1$) is used to control both the reference voltage controlled delay line 1263 and one or more other voltage controlled delay lines 1267. A time difference between a first delayed signal from the transmission line 1262 and a second delayed signal from the controlled delay line 1263 may be translated into a voltage on a capacitor and used to control the first variable delay of delay line 1263. The other voltage controlled delay line 1267 may receive data and produce delayed data in accordance with control voltage $V_I$. FIG. 13 is an example of a phase detector according to one embodiment of the present invention. The phase detector 1300 in FIG. 13 is a phase-frequency detector including two D-type Flip Flops ("DFF") 1310 and 1311, a reset circuit including an AND gate 1312, and an enable circuit including an inverter 1313. The reset and enable circuits are combined using an OR gate 1314 that drives the reset inputs of the DFFs. The phase detector of FIG. 13 is one possible way to implement the phase detector of FIG. 12B. As mentioned above, a phase detector may be implemented using the techniques described below and in U.S. patent application Ser. No. 11/200,472 filed on Aug. 9, 2004, entitled "Circuits and Methods for Reducing Static Phase Offset using Commutating Phase Detectors," naming Paul William Ronald Self as Inventor.

In one embodiment, the integrated transmission line resides on the same monolithic silicon die along with all the circuitry contained within each of the functional blocks shown in FIG. 12B. Embodiments of the present invention include an implementation of a totally integrated delay locked loop that does not use the period of a system clock as the timing reference, but rather, an integrated transmission line is used as the timing reference device.

The present embodiment includes a variety of advantageous features for the delay locked loop that may be included to improve the performance of the DLL. Before describing the operation of FIG. 12B, such features will be described. In this example, a periodic reference signal is generated by RC oscillator 1261 and provided to the inputs of the reference voltage controlled delay line 1263 and an integrated transmission line 1262. In other embodiments, a periodic signal may be generated by other circuits on the same integrated circuit or external to the integrated circuit and coupled to inputs of the transmission line and controlled delay line. During each period of the output signal of the RC oscillator (RCO), the amount of time that the RCO output signal is at a high logic level is larger than the flight time delay of the integrated transmission line. Further, the amount of time that the RCO output signal is at a high logic level is also larger than the longest possible time delay of the VCDL. An ENABLE function for the phase detector (PD) is another feature. In this embodiment, the PD includes an ENABLE function in order to guarantee that the phase detector correctly interprets the phase information from its inputs, IN1 and IN2. It is theoretically possible for the PD to incorrectly interpret the phase information at its inputs and then to continue to incorrectly interpret the phase relationship on subsequent cycles of the RC oscillator (RCO). By adding an ENABLE function to the PD, the PD is reset on every cycle by the RCO output signal, and thus, even if the PD incorrectly interprets the input phase relationship once, the ENABLE function will prevent it from continuing to incorrectly interpret the input phase relationship on subsequent cycles of the RCO.

The operation of the invention can be understood by referring to timing diagrams found in FIG. 14 and FIG. 15. The timing diagram found in FIG. 14 illustrates the behavior of the circuit when the time delay of the VCDL, $\tau_{DL}$, is smaller than the time delay of the integrated transmission line (ITL), $\tau_{TL}$. $V_{DL}$ is a delayed version of $V_{RCO}$ with a time delay equal to $\tau_{DL}$. $V_{TL}$ is also a delayed version of $V_{RCO}$ with a time delay equal to $\tau_{TL}$. Initially, $V_{RCO}$, $V_{TL}$, $V_{DL}$, UP, and DOWN are all logic low. With $V_{RCO}$ being low, the ENABLE function of the PD is de-asserted which forces the PD outputs, UP and DOWN, to logic low states. The first rising edge of $V_{RCO}$ launches a rising edge into the two delay lines, the ITL and the VCDL. When $V_{RCO}$ goes high, PD ENABLE becomes asserted which means that the outputs of the PD are allowed to change states as a function of the PD inputs, IN1 and IN2. Since $\tau_{DL}$ is shorter than $\tau_{TL}$, the first rising edge that the PD responds to comes from $V_{DL}$. The rising edge of $V_{DL}$ causes the UP output of the PD to go to a logic high level. An UP signal going high before the DOWN signal goes high indicates that the time delay of the VCDL needs to increase. A high logic level for the UP input of the charge pump (CP) causes the CP to turn on a charging current source connected to its output. The current source charges the capacitor $C_I$ which results in a voltage ramp in the positive direction for $V_I$. When $V_{TL}$ goes to a high logic level, the PD responds by forcing the DOWN output signal high. For a short amount of time both PD outputs, UP and DOWN, are at logic high levels simultaneously. When DOWN goes to a logic high, the CP will turn on a discharging current source that is connected to its output. While the UP and DOWN signals are both high, the CP's charging and discharging current sources are on simultaneously. Because the current sources are equal in value, the charging of $C_I$ ends and the positive voltage ramp of $V_I$ stops. At this point the PD resets itself which results in both PD outputs, UP and DOWN, going to logic low levels simultaneously. At some point after the PD resets itself, $V_{RCO}$ goes to a logic low which de-asserts the ENABLE function of the PD. The higher voltage of $V_I$ causes the time delay of the VCDL to increase. This increase in $\tau_{DL}$ is shown in the timing diagram of FIG. 14. The end result is that the feedback loop has caused $\tau_{DL}$ to move in a direction to bring it closer in value to $\tau_{TL}$.

The timing diagram found in FIG. 15 illustrates the behavior of the circuit when the time delay of the VCDL, $\tau_{DL}$, is longer than the time delay of the integrated transmission line (ITL), $\tau_{TL}$. Just like the previous example initially, $V_{RCO}$, $V_{TL}$, $V_{DL}$, UP, and DOWN are all logic low. With $V_{RCO}$ being low, the ENABLE function of the PD is de-asserted which forces the PD outputs, UP and DOWN, to logic low states. The first rising edge of $V_{RCO}$ launches a rising edge into the two delay lines, the ITL and the VCDL. When $V_{RCO}$ goes high, PD ENABLE becomes asserted which means that the outputs of the PD are allowed to change states as a function of the PD inputs, IN1 and IN2. Since $\tau_{DL}$ is longer than $\tau_{TL}$, the first rising edge that the PD responds to comes from $V_{TL}$. The rising edge of $V_{TL}$ causes the DOWN output of the PD to go to a logic high. A DOWN signal going high before the UP signal goes high indicates that the time delay of the VCDL needs to decrease. A high logic level for the DOWN input of the charge pump (CP) causes the CP to turn on a discharging current source connected to its output. The current source discharges the capacitor $C_I$ which results in a voltage ramp in the negative direction for $V_I$. When $V_{DL}$ goes to a high logic level, the PD responds by forcing the UP output signal high. For a short amount of time both PD outputs, UP and DOWN, are at logic high levels simultaneously. When UP goes to a logic high, the CP will turn on a charging current source that is connected to its output. While the UP and DOWN signals are both high, the CP's charging and discharging current sources are on simultaneously. Because the current sources are equal in value, the discharging of $C_I$ ends and the negative voltage ramp of $V_I$ stops. At this point the PD resets itself which results in both PD outputs, UP and DOWN, going to logic low levels simultaneously. At some point after the PD resets itself, $V_{RCO}$ goes to a logic low which de-asserts the ENABLE function of the PD. The lower voltage of $V_I$ causes the time delay of the VCDL to decrease. This decrease in $\tau_{DL}$ is shown in the timing diagram of FIG. 15. Again, the end result is that the feedback loop of the invention has caused $\tau_{DL}$ to move in a direction to bring it closer in value to $\tau_{TL}$.

In the manner described in the previous two paragraphs, the feedback loop will gradually adjust $V_I$ and the time delay of the voltage controlled delay line until the value of $\tau_{DL}$ matches the flight time delay of the integrated transmission line. The examples illustrated in FIGS. 14-15 are commonly referred to as delay locked loops. Thus, one can see that an integrated transmission line can be used as a timing reference device for a completely integrated feedback loop.

Described next are techniques for reducing static phase offset in timing loops. In the following description, for purposes of explanation, numerous examples and specific details are set forth in order to provide a thorough understanding of embodiments of the present invention. It will be evident, however, to one skilled in the art that the embodiments of the invention as defined by the claims may include some or all of the features in these examples alone or in combination with other features described below, and may further include obvious modifications and equivalents of the features and concepts described herein.

The present disclosure further includes circuits and methods that may be used to implement phase detection. The following circuits and methods may be used in a variety of applications that may benefit from improved phase detection. The following circuits and methods may also be used to improve the accuracy of the frequency generation and delay controls disclosed above. For example, the phase detectors disclosed above may be implemented using the techniques that will now be described.

Embodiments of the present invention reduce static phase offset by detecting mismatches in the phase detector, such as mismatched delays or currents, that contribute to static phase offset, and calibrate out the mismatches to reduce static phase offset. In one embodiment, a timing loop includes first and second phase detectors, wherein during a first time period, the first phase detector is coupled in a closed timing loop and the second phase detector is decoupled from the closed timing loop and calibrated. During a second time period, the second phase detector is coupled in a closed timing loop and the first phase detector is decoupled from the closed timing loop and calibrated. By commutating between phase detectors, one phase detector may be used to control the timing loop while the other phase detector is calibrated. After one phase detector is calibrated, it may be used to control the loop while the other phase detector is calibrated. Calibration may be used to eliminate or reduce mismatches in each phase detector that contribute to static phase offset error. In one embodiment, the phase detectors are alternately configured in a correction loop to perform calibration. A correction loop may detect operational parameters of the phase detector that relate to static phase error and generate a correction signal that is fed back into the phase detector being calibrated to null out (or autozero) the error. For example, a correction loop may detect mismatches, such as mismatched currents, in the phase detector. When phase detector is in a closed timing loop, these mismatches may result in a static phase offset. Thus, the correction signal may adjust the operation of the phase detector to reduce the mismatch, and thereby reduce the static phase offset. In one embodiment, mismatch may result in a voltage drift that is indicative of one or more mismatches in the phase detector. For example, the voltage drift may be at the output of the phase detector. Ideally, if both inputs of the phase detector receive the same input, then there should be no voltage drift at the output. Therefore, in one embodiment, a common input signal may be applied to both inputs of the phase detector being calibrated. The correction loop may detect any voltage drifts that may arise while the phase detector is receiving a common input, and generate a correction signal to reduce the mismatch causing the drift.

Figure 16A:
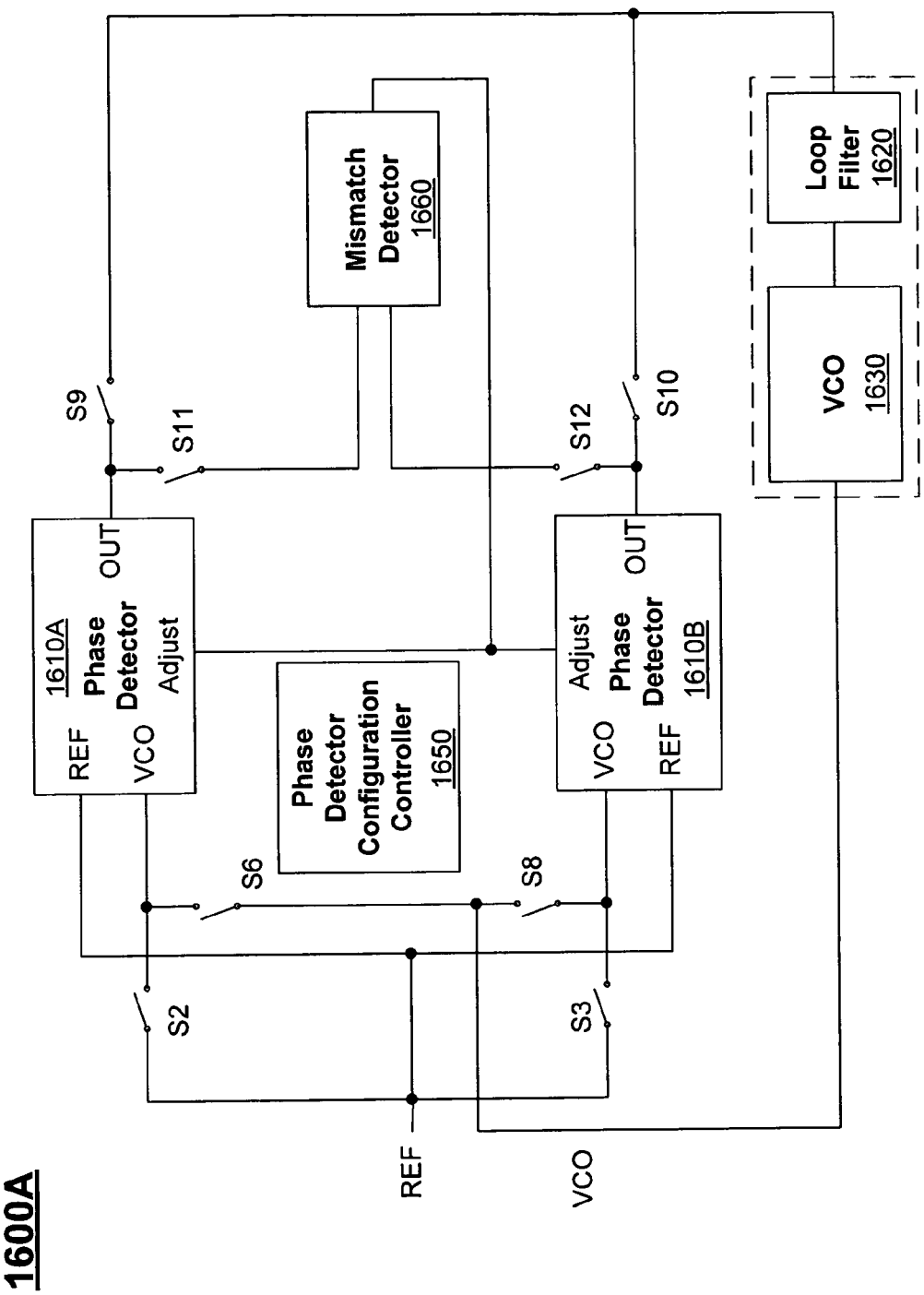
FIG. 16A illustrates a timing loop according to one embodiment of the present invention.

FIG. 16A illustrates a phase locked loop according to one embodiment of the present invention. In one embodiment, phase locked loop 1600A includes first and second phase detectors 1610A and 1610B that are alternately coupled to a mismatch detector 1660 and a voltage controlled oscillator 1630 during different time periods. For example, in order to reduce static phase offset in the system, one phase detector may be used to control the timing loop while the other phase detector goes through a calibration cycle (i.e. a correction cycle). In this example, a reference signal ("REF") is received in both phase detectors, and the phase detector outputs are alternately coupled through a loop filter 1620 and VCO 1630 to feedback inputs of each phase detector (here labeled "VCO"). When a correction cycle is completed, the phase detectors alternate (i.e., exchange roles), and the corrected phase detector is used to control the timing loop while the other phase detector goes through a correction cycle. In other words, embodiments of the present invention periodically disconnect one phase detector from the timing loop to correct the static phase offset. However, loop control must be maintained. Thus, two phase detectors are included so that when one phase detector is disconnected from the loop to be corrected, the other phase detector is configured into the loop and used to maintain control of the loop. Once one phase detector has been corrected, the system is reconfigured to switch the corrected phase detector into the loop and the other phase detector out of the loop for static phase offset correction. Thus, the system alternates (commutates) between two phase detectors to reduce static phase offset while maintaining control of the loop.

During static phase offset correction, the feedback input (here, VCO) of one of the phase detectors (e.g., PD 1610A) is decoupled from the timing loop (e.g., switch S6 is opened) and coupled to a common input signal (e.g., switch S2 is closed). In this example, the common input signal is the REF input. However, other signals could be used. The output of the phase detector to be calibrated is decoupled from the timing loop (e.g., switch S9 is opened) and configured into a correction loop. For example, the output of the phase detector may be coupled to mismatch detector 1660 (e.g., switch S11 is closed). Ideally, when the loop is open and the same signal is applied to both inputs of the phase detector, there should be no net change in the output of the phase detector if the delays and circuits are perfectly matched. For example, if the delay between REF and the output is the same as the delay between VCO and the output, or if the circuitry is matched, then there should be no static phase offset. However, typically the delays are different and the circuits are mismatched due to manufacturing variations and imperfections. Thus, if the same signal is applied to both inputs, there will be a net change at the output. The net change will translate into a static phase offset between the REF and VCO signals when the timing loop is closed. Accordingly, embodiments of the present invention detect the change at the output of the phase detector when a common signal is applied to the inputs and adjust the circuitry in the phase detector to reduce the detected change.

During calibration, mismatch detector 1660 is coupled to the output of the phase detector to detect changes in the phase detector output. Thus, mismatch detector 1660 may include inputs coupled through switches S11 and S12 to alternately detect changes in both phase detectors. The output of mismatch detector 1660 includes a correction signal that is coupled to an adjust input of phase detector 1610A and an adjust input of phase detector 1610B. A variety of circuit techniques may be used to detect mismatch in phase detectors, and a variety of correction signals and adjustment techniques may be used to calibrate the phase detector. In particular, if the change in the output of the phase detector is positive, then the adjustments (e.g., to delays, currents, or voltages) should cause the output to change in the negative direction. Similarly, if the change in the output of the phase detector is negative, then the adjustments should cause the output to change in the positive direction.

In accordance with this embodiment, during a first time period, phase detector 1610A is configured in a closed loop with voltage controlled oscillator 1630, and phase detector 1610B is in a correction loop with mismatch detector 1660, and in accordance therewith, mismatch detector 1660 reduces the static phase offset generated by phase detector 1610B. Similarly, during a second time period, phase detector 1610B is configured in a closed loop with voltage controlled oscillator 1630, and phase detector 1610A is in a correction loop with mismatch detector 1660, and in accordance therewith, mismatch detector 1660 reduces the static phase offset generated by phase detector 1610A. In one embodiment, phase locked loop 1600A further comprises a phase detector configuration controller 1650. Configuration controller 1650 may be used to reconfigure the phase detectors between closed loop configuration and calibration. As illustrated below, an example configuration controller may include a counter to periodically reconfigure the phase detectors.

Figure 16B:
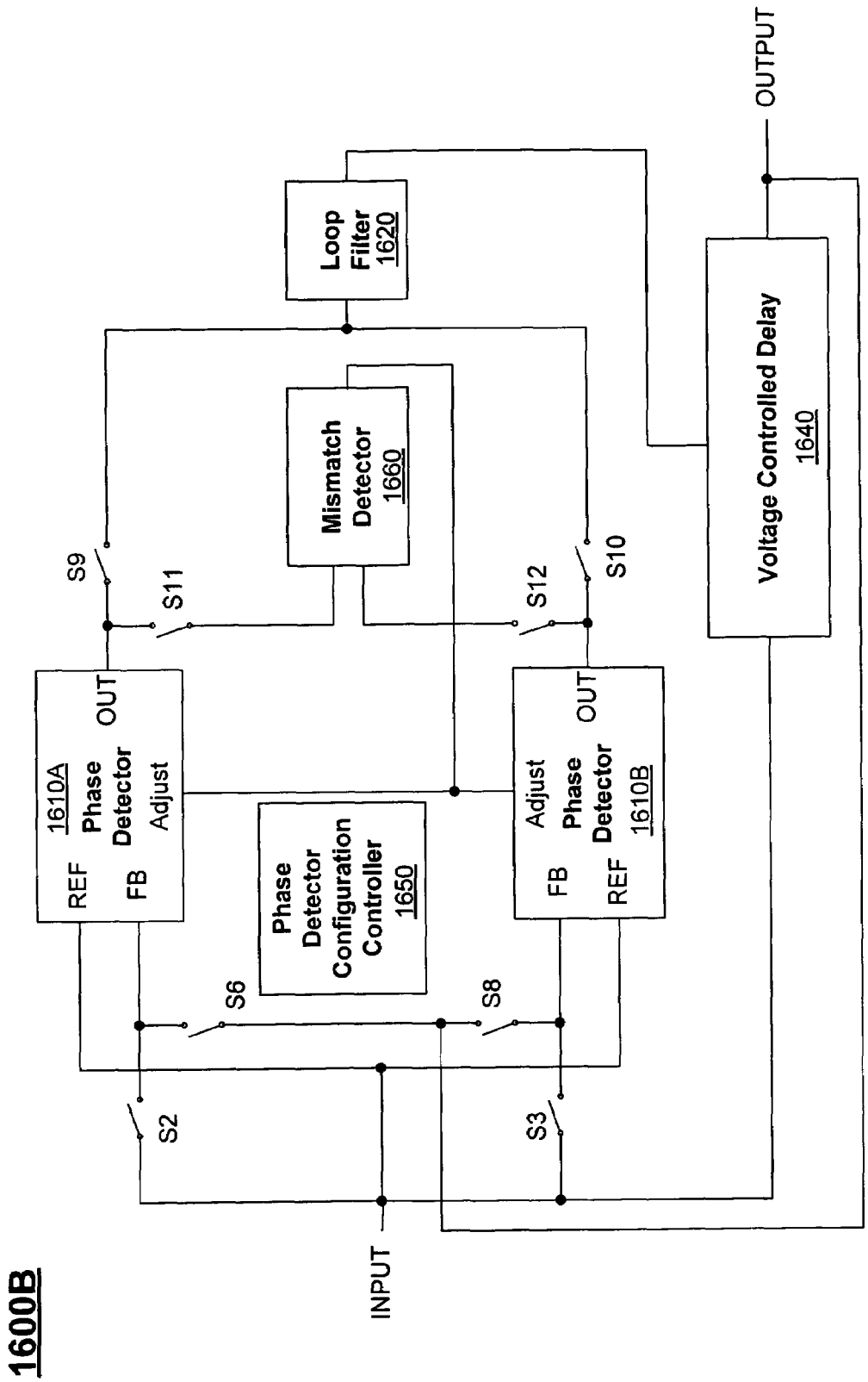
FIG. 16B illustrates a timing loop according to another embodiment of the present invention.

FIG. 16B illustrates a delay locked loop ("DLL") including commutating first and second phase detectors 1610A and 1610B that are alternately configured in a closed timing loop while the other is calibrated. The DLL 1600B further includes a loop filter 1620, voltage controlled delay 1640, mismatch detector 1660, and phase detector configuration controller 1650. Loop filter 1620 is coupled through switches S9 and S10 to the outputs of phase detectors 1610A and 1610B. The output of loop filter 1620 is coupled to one input of voltage controlled delay 1640, and a second input of voltage controlled delay 1640 is coupled to an input signal ("INPUT"). The output of voltage controlled delay 1640 is coupled through switches S6 and S8 to the feedback inputs ("FB") of phase detectors 1610A and 1610B. The input signal is coupled to the reference inputs ("REF") of phase detectors 1610A and 1610B. The input is also coupled through switches S2 and S3 to the FB input of phase detectors 1610A and 1610B. In this example, when phase detector 1610A is being calibrated, switches S2 and S11 are closed, and switches S6 and S9 are open. Thus, both the REF and FB inputs of phase detector 1610A receive the same signal (e.g., here, the input signal) for calibration. During the time that phase detector 1610A is being calibrated, switches S8 and S10 are closed, and switches S3 and S12 are open. Thus, phase detector 1610B is configured to control the timing loop. When the phase detectors commutate (i.e., exchange roles), switches S2 and S11 are opened, and switches S6 and S9 are closed. Thus, phase detector 1610A is configured to control the timing loop. During this time period, switches S8 and S10 are opened, and switches S3 and S12 are closed. Accordingly, phase detector 1610B may be calibrated while phase detector 1610A controls the timing loop.

EXAMPLE IMPLEMENTATION OF A PHASE DETECTOR

Figure 17:
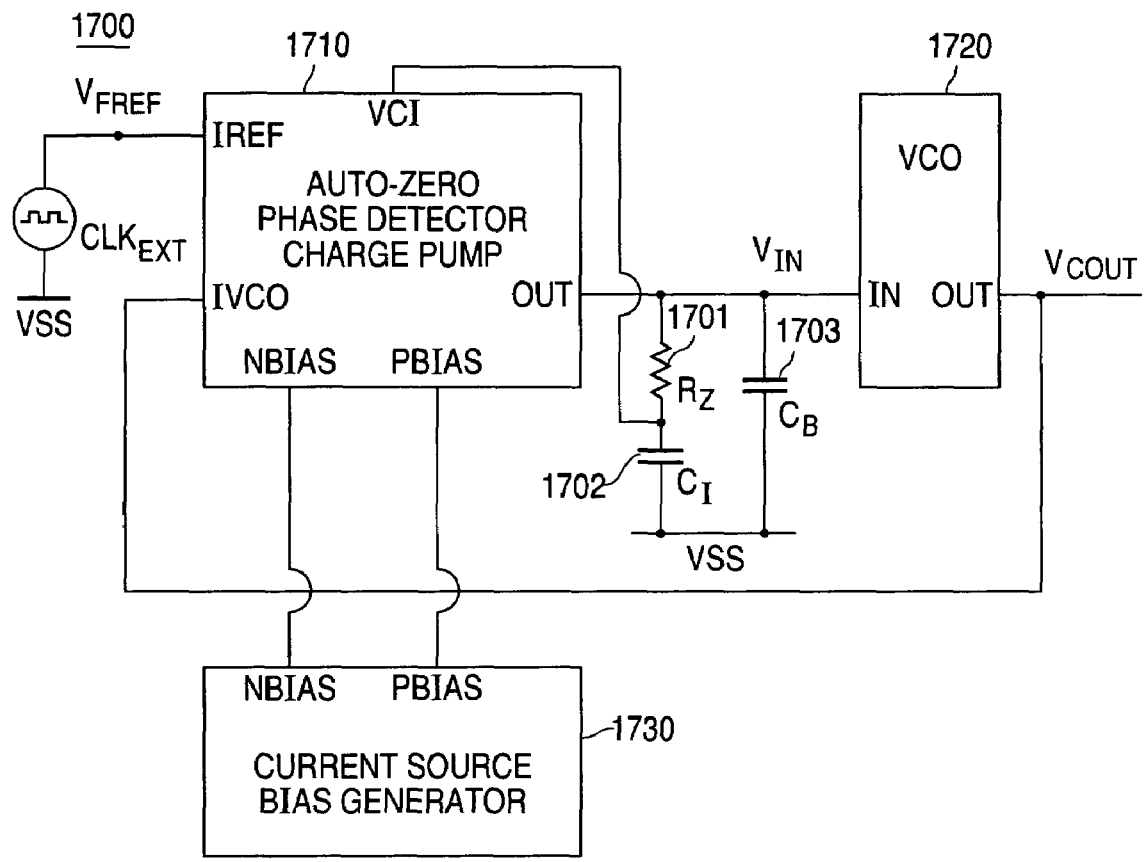
FIG. 17 is an example application of a phase locked loop with reduced static phase offset according to one embodiment of the present invention.

FIG. 17 is an example application of a timing loop 1700 with reduced static phase offset according to one embodiment of the present invention. FIG. 17 shows a typical implementation of a zero delay buffer ("ZDB") using a phase locked loop ("PLL"). PLL 1700 includes an auto-zero phase-frequency detector/charge pump 1710 ("PFD-CP"), which is a specific implementation of the commutating phase detector approach described above. PLL 1700 further includes a VCO 1720, current source bias generator 1730, and loop filter including resistor 1701 ("$R_Z$"), integration capacitor 1702 ("$C_1$"), and capacitor 1703 ("$C_B$"). A first input to the PFD-CP 1710 labeled IREF is coupled to a clock signal ("$CLK_{EXT}$"), which may be an external clock, for receiving a signal $V_{FREF}$. The second input of the PFD-CP 1710 labeled IVCO is coupled to the output of VCO 1720 labeled OUT to receive output signal $V_{COUT}$, which may also be the system output. Bias generator 1730 generates the necessary voltages and currents for biasing circuits in PFD-CP 1710 and possibly other circuits.

Figure 1A:
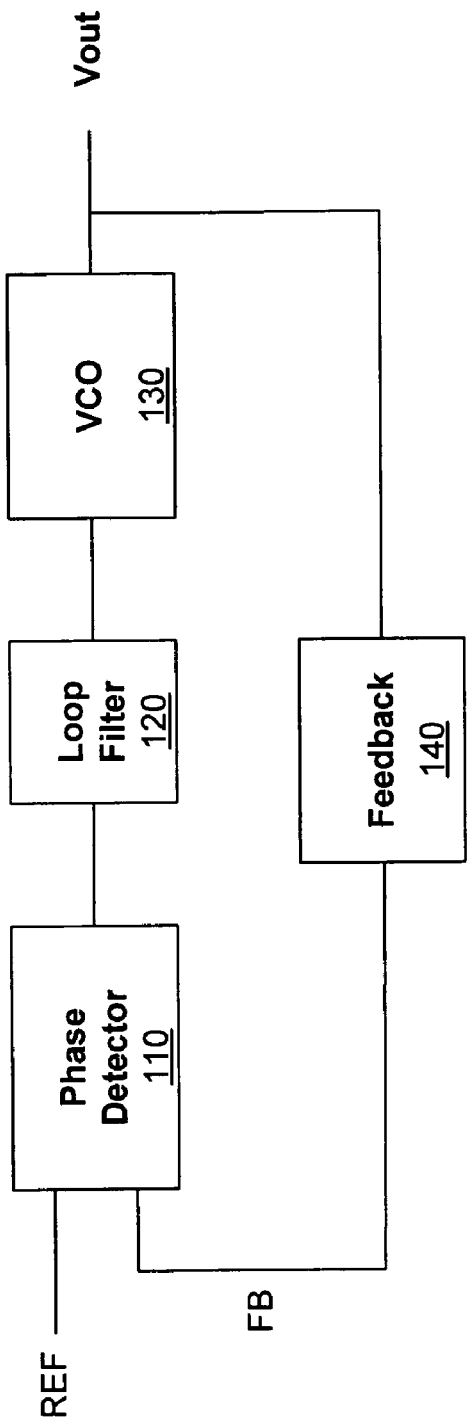
FIG. 1A illustrates phase locked loop architecture.
Figure 1B:
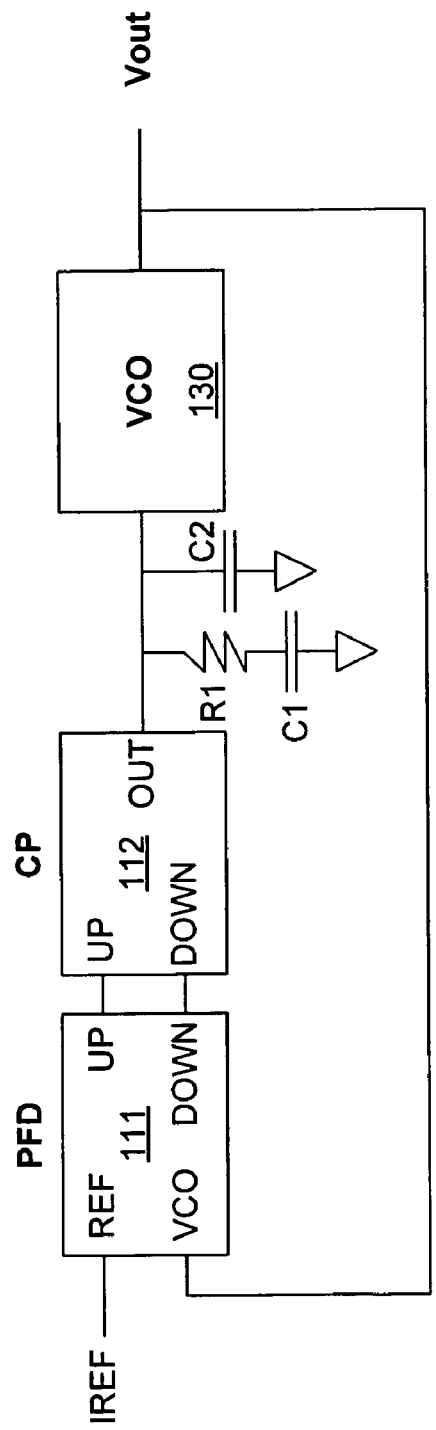
FIG. 1B illustrates a zero delay buffer.
Figure 1C:
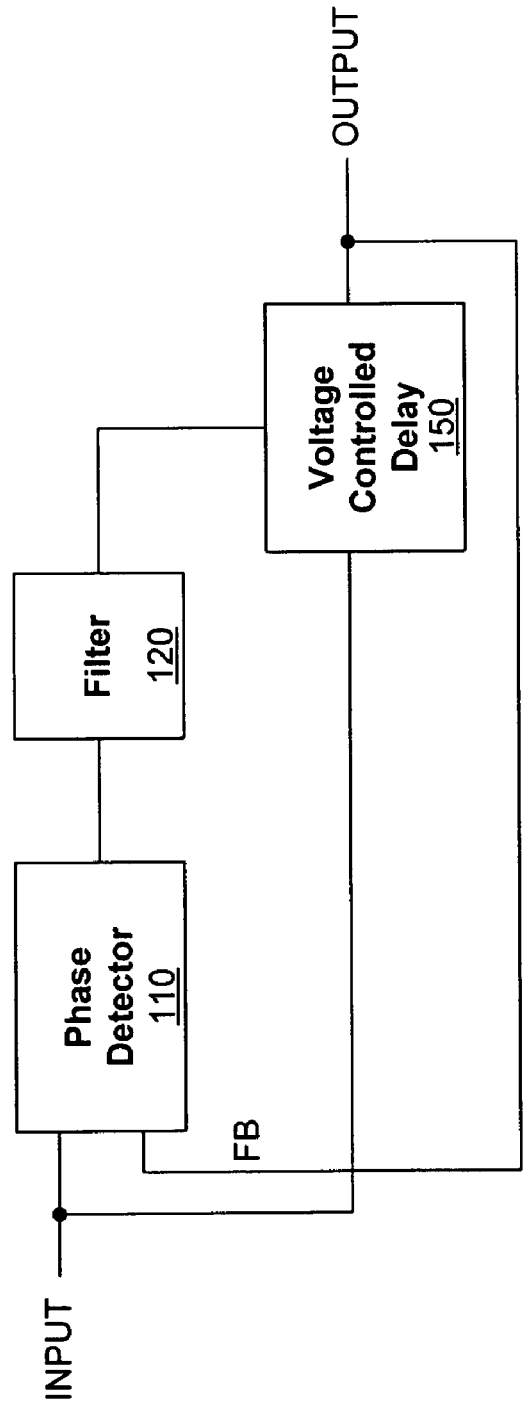
FIG. 1C illustrates a delay locked loop.

Referring to FIG. 1B, for an ideal ZDB, the input signal, IREF, would be exactly in phase with the output signal $V_{OUT}$. This ideal ZDB, therefore, would have a static phase offset of zero seconds. Embodiments of the present invention may be used to substantially reduce the amount of static phase offset in a ZDB, for example, caused by various imperfections in the semiconductor process. In particular, non-zero static phase offset typically is caused by manufacturing variations and imperfections in the phase-frequency detector ("PFD") and charge pump ("CP"). If the PFD operated ideally, the propagation delay from the VCO feedback input of the PFD to the output DOWN (e.g., see FIG. 1B) would be exactly equal to the propagation delay from the REF input to the output UP. If the CP operated ideally, there would be no net charge produced at the output when the inputs, UP and DOWN, receive signals that have exactly the same pulse width. If the PFD and CP together operated ideally, there would be no net charge delivered from the CP output, OUT, when the PFD input signals, IREF and $V_{OUT}$, have exactly the same phase. However, since the actual PFD and CP are non-ideal, if IREF and $V_{OUT}$ are exactly in phase, then the CP will produce some non-zero amount of charge at the output and into the PLL's loop filter. In a closed loop, the PLL will translate the non-zero charge into a static phase offset between IREF and $V_{OUT}$.

In the example shown in FIG. 17, an auto-zeroing phase detector technique is used to reduce static phase offset. In this example, the voltage on the integration capacitor 1702 is provided at a VCI input of the improved auto-zero PFD-CP 1710. As illustrated by the example in FIG. 18A-B, this voltage may be used, together with the architecture described above, to reduce static phase offset.

Figure 20:
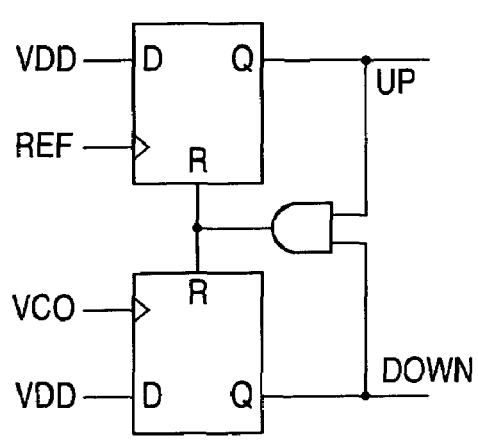
FIG. 20 is an example of a phase-frequency detector that may be used in the circuit of FIG. 17 according to one embodiment of the present invention.
Figure 18A:
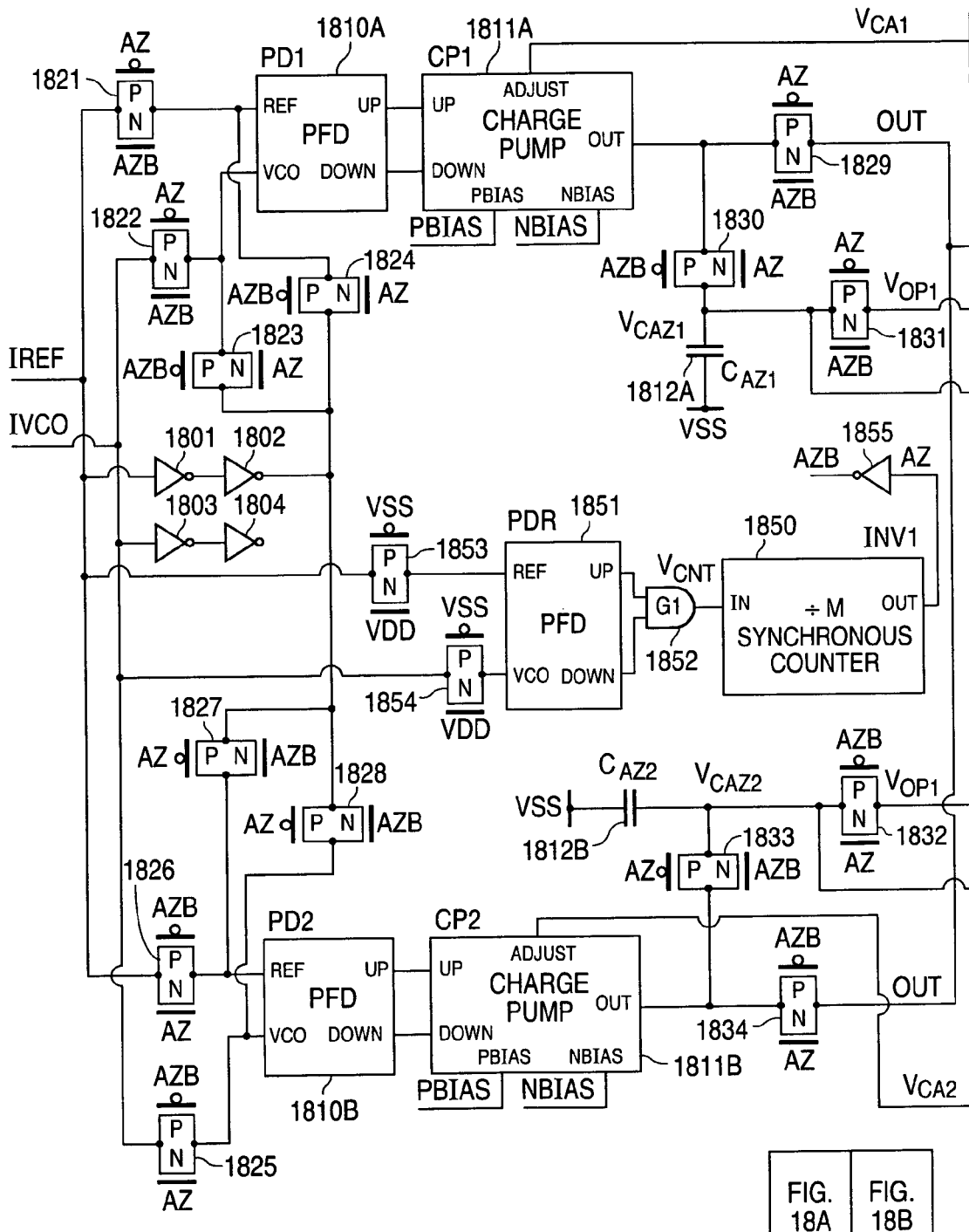
FIG. 18A-B is an example of an auto-zero phase detector according to one embodiment of the present invention.
Figure 18B:
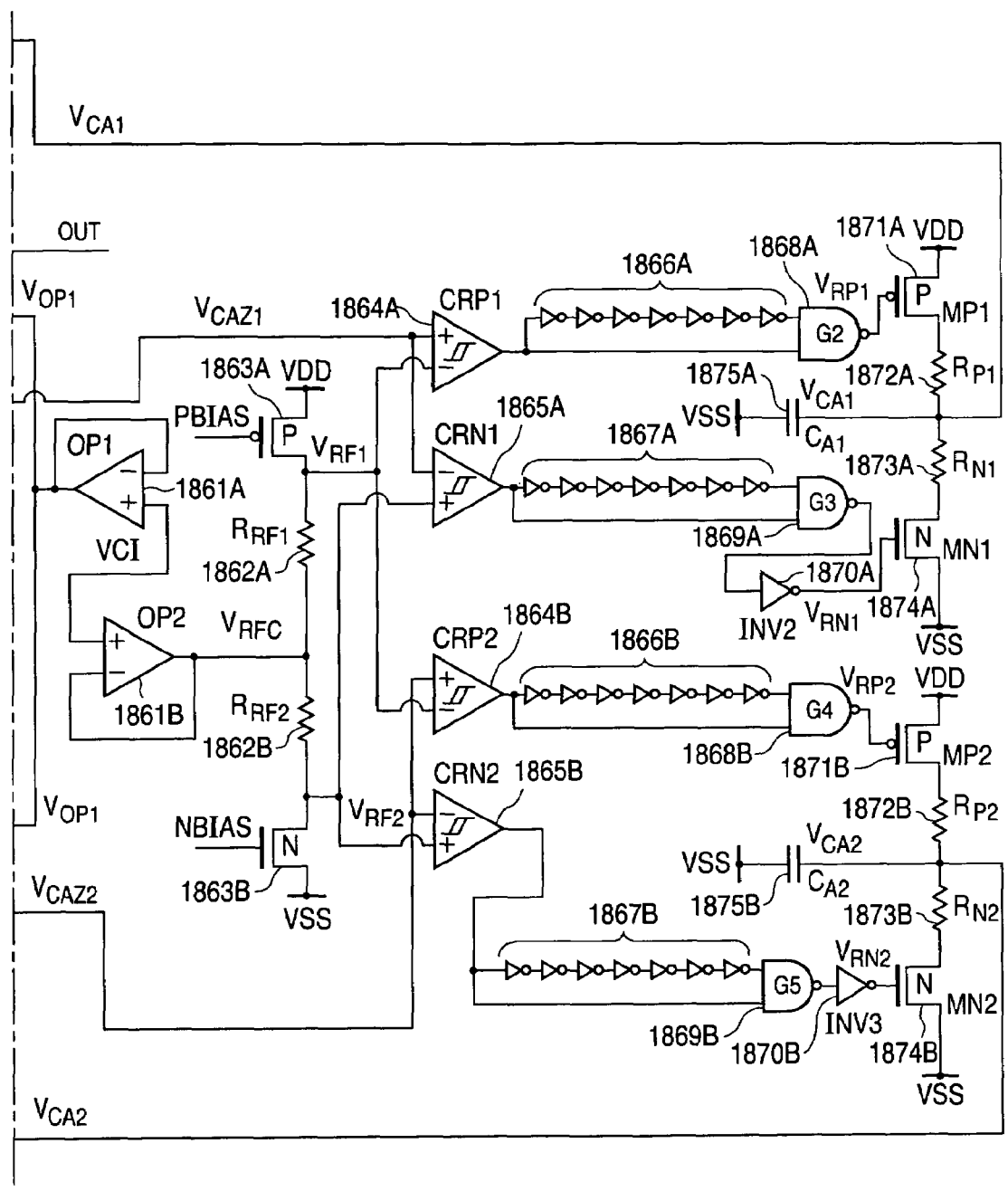

FIG. 18A-B is an example of an auto-zero phase detector 1800 ("AZPD") according to one embodiment of the present invention. AZPD 1800 includes two phase-frequency detector and charge pump combinations ("PFD-CP"). The first PFD-CP includes PFD 1810A ("PD1") and CP 1811A ("CP1"). The second PFD-CP includes PFD 1810B ("PD2") and CP 1811B ("CP2"). An example phase-frequency detector that may be used is shown in FIG. 20. When one of the PFD-CPs is disconnected from the timing loop for mismatch correction, the other PFD-CP is configured into the timing loop to maintain loop control. After one PFD-CP has been through a correction cycle, the other PFD-CP is disconnected from the loop for correction, and the previously corrected PFD-CP is configured into the loop to maintain loop control. Thus, the two PFD-CP combinations commutate (i.e., exchange) operational states between a correction (or calibration) state and a feedback control state. Thus, each PFD-CP can be periodically corrected while maintaining feedback control of the timing loop.

In particular, when PFD 1810B and CP 1811B are configured in a feedback control state and PFD 1810A and CP 1811A are configured in a correction state, switches 1821 and 1822 are open and switches 1823 and 1824 are closed. The switches in this example are implemented using parallel N-channel and P-channel MOS transistors. Thus, the reference signal input IREF and feedback signal input IVCO are disconnected from the REF and VCO inputs of PD1. Rather, the IREF input is buffered by two inverters 1801 and 1802 and provided to both inputs of PD1 through switches 1823 and 1824. Thus, both the REF and VCO inputs of PD1 receive a common input signal. Furthermore, the output OUT of auto-zero phase detector 1800 is decoupled from the output of CP1 by opening switch 1829. Instead, the output of CP1 is coupled through switch 1830 to calibration capacitor 1812A ("$C_{AZ1}$").

It should be noted that prior to entering a correction cycle, switch 1831 is closed and switch 1830 is open. In this configuration, calibration capacitor 1812A will be driven by the output of unity gain buffer 1861A, which in turn receives an input from VCI—the voltage on the integration capacitor 1702 in the loop filter (see FIG. 17). Thus, when the output of CP1 is disconnected from the timing loop and connected to calibration capacitor 1812A, the voltage on calibration capacitor 1812A is initially VCI. Additionally, when the correction cycle begins, switch 1831 is opened so that the voltage on calibration capacitor 1812A may be driven by the output of CP1.

As mentioned above, at the beginning of a correction cycle, the voltage on capacitor 1812A is VCI. When switch 1830 is closed, the output of CP1 is coupled to the calibration capacitor 1812A. Calibration capacitor 1812A is, in this example, coupled to a window comparator for detecting when the voltage on capacitor 1812A is above or below a threshold. In this example, the threshold of the comparator is generated around VCI using unity gain buffer 1861B ("OP2") and series connected resistors 1862A-B and transistors 1863A-B. The reason for this is that the static phase offset error in the charge pump may be a function of the voltage on $V_{IN}$ (see FIG. 17). Thus, when a correction cycle occurs it may be desirable to have the voltage on the calibration capacitor to be the same as the voltage at the output of the CP when the CP is configured in the timing loop. However, when PD1 and CP1 are in closed loop mode and the timing loop is locked, there is very little current going into $R_Z$, so the voltage on $C_I$ and $C_B$ are substantially the same. Normally, $C_I$ is larger (e.g., 10 times larger) than $C_B$. Thus, in lock VCI and $V_{IN}$ are substantially the same. However, VCI has less electrical noise. Since $V_{IN}$ and VCI are about the same, $V_{OP1}$ is generated from VCI and is used to set the initial voltage on the calibration capacitor at the beginning of each correction cycle. As mentioned above, VCI is coupled through unity gain buffer 1861A ("OP1") to the calibration capacitor when the PD is in the timing loop. When the PFD-CP enters a correction cycle, $V_{OP1}$ is disconnected from the calibration capacitor so that the voltage on the calibration capacitor can change. In this example, the circuit detects mismatch by determining the polarity of the voltage drift on the calibration capacitor. Thus, when the CP is disconnected from the loop, the calibration capacitor voltage is at the same voltage as the VCI, which is also the center of the comparator window.

In this example, calibration capacitor 1812A is coupled to a window comparator. Here, capacitor 1812A is coupled to the positive input of a first comparator 1864A and the negative input of a second comparator 1865A. The negative input of comparator 1864A is coupled to resistor 1862A ("$R_{RF1}$"), which is the high threshold voltage (i.e., upper trip point), $V_{RF1}$, of the comparator window. Thus, the voltage on calibration capacitor 1812A, $V_{CAZ1}$, will initially be VCI, which is below the high threshold voltage, and the output of comparator 1864A is initially low (i.e., because the negative input, $V_{RF1}$, is initially at a higher voltage than the positive input, $V_{CAZ1}$). However, if the voltage on the calibration capacitor increases above the high threshold voltage during the correction cycle (e.g., because of circuit mismatches in the PFD or CP), the output of comparator 1864A will transition from low to high. A positive going voltage on the calibration capacitor may indicate that the charge pump is sourcing more current than it is sinking, for example. Thus, to correct this mismatch, when the window comparator detects a positive going voltage on the calibration capacitor, a correction signal is generated to trigger a reduction in the charge pump current source and/or increase the charge pump current sink. In this example, the correction signal is a voltage on capacitor 1875A, which is coupled to the adjust input of CP 1811A. The correction signal is generated by coupling the output of comparator 1864A directly to one input of a NAND gate 1868A and to the other input of NAND gate 1868A through a delay circuit 1866A comprising series connected inverters to create a pulse. The pulse turns PMOS transistor 1871A on to generate a correction current through resistor 1872A into capacitor 1875A to change the voltage on the adjust input of CP 1811A. The correction signal may be used to adjust the source current in CP 1811A, for example.

Similarly, calibration capacitor 1812A is coupled to the negative input of a second comparator 1865A. The positive input of comparator 1865A is coupled to resistor 1862B ("$R_{RF2}$"), which is the low threshold voltage (i.e., lower trip point), $V_{RF2}$, of the comparator window. Thus, the voltage on calibration capacitor 1812A, $V_{CAZ1}$, will initially be VCI, which is above the low threshold voltage, and the output of comparator 1865A is initially low (i.e., because the negative input, $V_{CAZ1}$, is initially at a higher voltage than the positive input, $V_{RF2}$). However, if the voltage on the calibration capacitor decreases below the low threshold voltage during the correction cycle (e.g., because of mismatched circuits in the PFD or CP), the output of comparator 1865A will transition from low to high. A negative going voltage on the calibration capacitor may indicate that the charge pump is sinking more current than it is sourcing, for example. Thus, to correct this mismatch, when the window comparator detects a negative going voltage on the calibration capacitor, a correction signal is generated to trigger a reduction in the charge pump current sink and/or increase the charge pump current source. The correction signal is generated by coupling the output of comparator 1865A directly to one input of a NAND gate 1869A and to the other input of NAND gate 1869A through a delay circuit 1867A comprising series connected inverters to create a pulse. The pulse turns NMOS transistor 1874A on to generate a correction current through resistor 1873A into capacitor 1875A to change the voltage on the adjust input of CP 1811A.

As illustrated by the above example, comparators may be used to determine the polarity of the error so that correction may be made in the opposite direction. For noise considerations, a window may be used so that a minimum change in voltage on the calibration capacitor is required before any correction is made. Thus, if a designer opts to use a window comparator implementation to detect mismatch at the output of the phase detector, the voltage range of the comparator window may be set according to the noise tolerance of the system. The amount that the voltage on the calibration capacitor may increase or decrease before triggering a correction signal may be set to achieve target static phase offset tolerance. It is to be understood that other techniques may be used to detect changes at the output of the phase detector, such as by averaging out the noise, for example.

Figure 19:
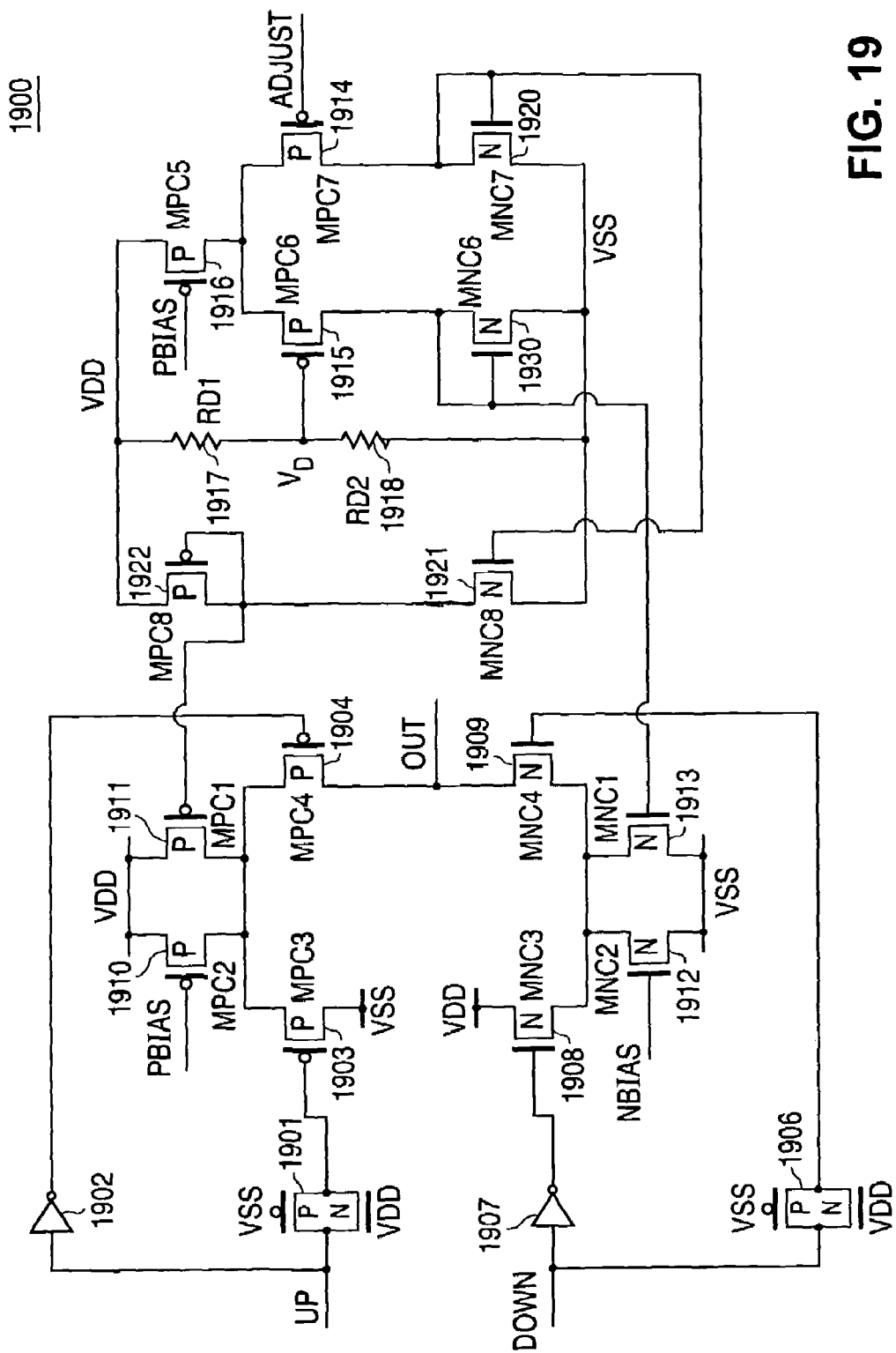
FIG. 19 is an example of an adjustable charge pump according to one embodiment of the present invention.

FIG. 19 is an example of an adjustable charge pump 1900 according to one embodiment of the present invention. Charge pump 1900 ("CP") includes a first input "UP" coupled through switch 1901 and inverter 1902 to a differential current steering network including PMOS transistors 1903 ("MPC3"), 1904 ("MPC4"), 1910 ("MPC2"), and 1911 ("MPC1"). The gate of transistor 1904 is coupled though inverter 1902 to the "UP" input terminal. When a positive going signal is received on the "UP" terminal, inverter 1902 changes the polarity so that transistor 1904 is activated when an UP signal is received. The UP signal is also coupled through switch 1901 (here, a transmission gate including parallel PMOS and NMOS devices) to the gate of PMOS transistor 1903. Switch 1901 is used to delay the signal by a time period approximately equal to the delay of inverter 1902. When a positive going signal is received at the UP terminal, transistor 1903 will turn off. Since transistors 1903 and 1904 are biased by common devices 1910 and 1911, a signal received at the UP input terminal will steer current between devices 1903 and 1904. The current through transistor 1904 is used to drive the output of CP 1900. This current is referred to as the charge pump source current.

Similarly, charge pump 1900 ("CP") includes a second input "DOWN" coupled through switch 1906 and inverter 1907 to a differential current steering network including NMOS transistors 1908 ("MNC3"), 1909 ("MNC4"), 1912 ("MNC2"), and 1913 ("MNC1"). The gate of transistor 1908 is coupled though inverter 1907 to the "DOWN" input terminal. When a positive going signal is received on the "DOWN" terminal, inverter 1907 changes the polarity so that transistor 1908 is inactivated when a "DOWN" signal is received. The "DOWN" signal is also coupled through switch 1906 to the gate of NMOS transistor 1909. Switch 1906 is used to delay the signal by a time period approximately equal to the delay of inverter 1907. When a positive going signal is received at the "DOWN" terminal, transistor 1909 will turn on. Since transistors 1908 and 1909 are biased by common devices 1912 and 1913, a signal received at the "DOWN" input terminal will steer current between the devices 1908 and 1909. The current through transistor 1909 is also used to drive the output of CP 1900. This current is referred to as the charge pump sink current.

Figure 21:
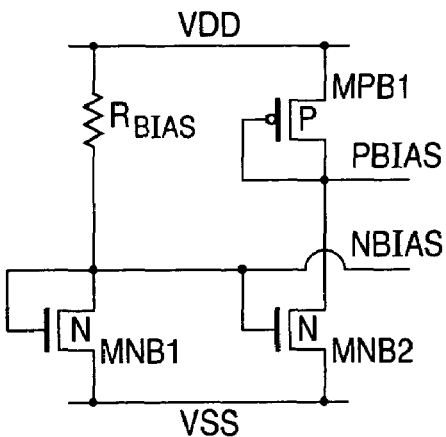
FIG. 21 is an example of a bias generator that may be used in the circuit of FIG. 17 according to one embodiment of the present invention.

Ideally, transistors 1903, 1904, 1910, 1908, 1909, and 1912 should be designed so that the source and sink currents are exactly matched. Thus, if the "UP" and "DOWN" pulses are exactly the same, an equal amount of current will be sourced to and sunk from the output. This ideal case would produce zero static phase offset. However, typically there will always be some device mismatch. Moreover, the bias circuits used to generate PBIAS for transistor 1910 and NBIAS for transistor 1912 may also include some error. An example bias circuit for producing PBIAS and NBIAS is shown in FIG. 21. In this example, the source and sink currents may be adjusted by including transistor 1911 in parallel with transistor 1910, and including transistor 1913 in parallel with transistor 1912. These devices may be used to modify the source and sink currents in transistors 1904 and 1909 to reduce mismatch and the corresponding static phase offset. In this example, an adjust input terminal of CP 1900 is coupled to the gate of PMOS transistor 1914. Transistor 1914 is one-half of a differential pair. The other differential transistor is PMOS device 1915. Transistors 1914 and 1915 are biased by PMOS transistor 1916, which has a gate coupled to a bias voltage, PBIAS, and a drain coupled to the common sources of transistors 1914 and 1915. The gate of transistor 1915 is coupled to a resistor divider including resistors 1917 and 1918. These resistors set the voltage $V_D$ at the gate of device 1915. Current in the drain of transistor 1914 is coupled through current mirrors comprising transistors 1920, 1921, 1922, and 1911 to source coupled transistors 1903 and 1904. Similarly, current in the drain of transistor 1915 is coupled through current mirrors comprising transistors 1930 and 1913 to source coupled transistors 1908 and 1909. Thus, when the adjust input increases above $V_D$, the current in transistor 1913 increases and the current in transistor 1911 decreases, thereby increasing the sink current in transistor 1909 and decreasing the source current in transistor 1904. Similarly, when the adjust input decreases below $V_D$, the current in transistor 1911 increases and the current in transistor 1913 decreases, thereby increasing the source current in transistor 1904 and decreasing the sink current in transistor 1909.

Consequently, referring to FIG. 18, it can be seen that when a mismatch results in the source current being greater than the sink current, the voltage on the calibration capacitor will increase and cause comparator 1864A to change states. This will result in a current pulse into capacitor 1875A, which will increase the voltage on the adjust terminal. Increasing the voltage on the adjust terminal will, in turn, decrease the source current and increase the sink current. Accordingly, the mismatch may be reduced. Likewise, it can be seen that when a mismatch results in the sink current being greater than the source current, the voltage on the calibration capacitor will decrease and cause comparator 1865A to change states. This will result in a current pulse out of capacitor 1875A through transistor 1874A (i.e., a discharge current pulse), which will decrease the voltage on the adjust terminal. Decreasing the voltage on the adjust terminal will, in turn, increase the source current and decrease the sink current. Accordingly, the mismatch error may again be reduced.

As mentioned above, when phase-frequency detector 1810A and charge pump 1811A in FIG. 18 are being calibrated, phase-frequency detector 1810B and charge pump 1811B are configured to control the timing loop. Additionally, during this time period a second calibration capacitor 1812B is coupled to the output of opamp 1861A and set to a voltage of VCI (the voltage on the loop integration capacitor). Thus, during a second time period phase-frequency detector 1810A and charge pump 1811A are reconfigured to control the timing loop and phase-frequency detector 1810B and charge pump 1811B may be calibrated (i.e., switches 1823, 1824, 1830, 1825, 1826, 1832, 1834 are opened and switches 1821, 1822, 1829, 1831, 1827, 1828, 1833 are closed). In this example, the circuitry for detecting the mismatch in phase-frequency detector 1810B and charge pump 1811B operates in the same way as the circuitry for detecting the offset in phase-frequency detector 1810A and charge pump 1811A, wherein the high and low threshold voltages around VCI are again set by the voltages across resistors 1862A-B, and devices 1864-1875A have corresponding counterparts for 1864-1875B for correcting PFD 1810B and CP 1811B. Counter 1850 may be used to generate autozero signals, AZ and AZB, to control the switches to alternate between phase detectors. In one embodiment, the modulus for the counter is eight (M=8), so every four cycles the system switches between PFD-CPs. It may be desirable in some implementations to alternate between PFD-CPs after all phase information has been received (e.g., after the phase information from both IREF and IVCO have been received). After both edges have been received, no more timing information is received until the next cycle. Thus, in this example, the counter is driven by both the reference signal IREF and feedback signal IVCO through transmission gates 1853 and 1854, phase-frequency detector 1851, and AND gate 1852. PFD 1851 may be used to ensure that the counter only switches the system after both REF and VCO edges have been received. Devices 1853 and 1854 may be used to approximately match the delays of switches 1821, 1822, 1825, and 1826.

Figure 22:
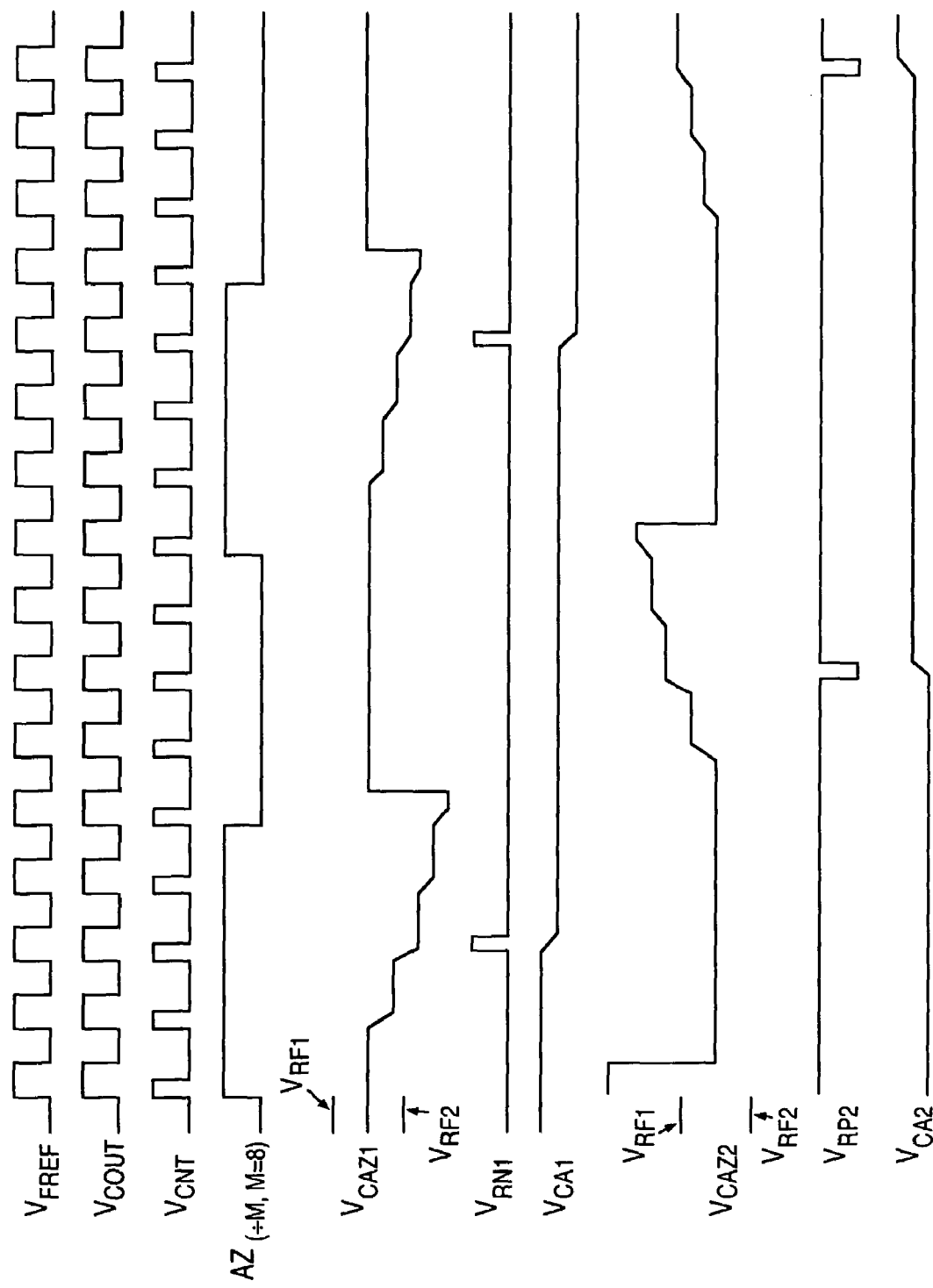
FIG. 22 shows example waveforms for a circuit according to one embodiment of the present invention.

FIG. 22 shows example waveforms for a circuit according to one embodiment of the present invention. Operation of the examples shown in FIGS. 17-21 may be understood by referring to the timing diagram shown in FIG. 22. In the timing diagram, the phase-frequency detector and charge pump is assumed to be used in a zero delay buffer application. In the timing diagram of FIG. 22, the PLL is assumed to be very nearly in a locked condition. The inputs have almost no phase difference between them. From the timing diagram, it can be seen that the output of AND gate 1852 (FIG. 18) will be synchronized to $V_{FREF}$ and $V_{COUT}$. Thus, CP 1811A will be in a correction cycle during a time period equal to the first four cycles of $V_{FREF}$, the CPs will alternate at the end of the fourth cycle of $V_{FREF}$, and CP 1811B will be in a correction cycle for a time period equal to the second four cycles of $V_{FREF}$. It is to be understood that a variety of time periods and techniques for switching between phase detectors could be used. In this example timing diagram, CP 1811A causes the voltage $V_{CAZ1}$ on calibration capacitor 1812A to decrease over time. Accordingly, a pulse $V_{RN1}$ is generated at the gate of NMOS transistor 1874A, which decreases the voltage $V_{CA1}$ on capacitor 1875A, and therefore decreases the sink current and increases the source current of CP 1811A. During the next correction cycle for CP 1811A, it can be seen that the voltage drift of $V_{CAZ1}$ is reduced (i.e., the mismatch error is reduced thereby reducing static phase offset). Similarly, CP 1811B causes the voltage $V_{CAZ2}$ on calibration capacitor 1812B to increase over time. Accordingly, a pulse $V_{RP2}$ is generated at the gate of PMOS transistor 1871B, which increases the voltage $V_{CA2}$ on capacitor 1875B, and therefore increases the sink current and decreases the source current of CP 1811B. During the next correction cycle for CP 1811B, it can be seen that the voltage drift of $V_{CAZ2}$ is reduced (i.e., the mismatch error is reduced thereby reducing static phase offset).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the above embodiments are described using voltage controlled oscillators or delays, it is to be understood that current controlled devices could also be used. Furthermore, digital implementations of the phase detector, filter, oscillator, or delay could also be used. Based on the above disclosure and the following claims, other arrangements, embodiments, implementations and equivalents will be evident to those skilled in the art and may be employed without departing from the spirit and scope of the invention as defined by the claims.

What is claimed is:

1. An integrated circuit comprising:
    a phase detector and a voltage controlled oscillator coupled in series; and
    a transmission line having an input coupled to at least one output of the voltage controlled oscillator, the transmission line providing a time delay between the transmission line input and a transmission line output,
    wherein the phase detector includes a first input coupled to the transmission line output and a second input coupled to at least one output of the voltage controlled oscillator, wherein an entire propagation time delay between the transmission line input and the transmission line output sets the frequency of the voltage controlled oscillator, and wherein the phase detector, the voltage controlled oscillator, and the transmission line are integrated on a single integrated circuit, wherein the voltage controlled oscillator output is conditioned to avoid locking onto fractional values of the entire propagation time delay.

2. The integrated circuit of claim 1 further comprising pulse removal logic coupled between the voltage controlled oscillator and the transmission line.

3. The integrated circuit of claim 1 further comprising a lock control circuit.

4. The integrated circuit of claim 1 wherein the input of the transmission line and the second input of the phase detector are coupled to the same output of the voltage controlled oscillator.

5. The integrated circuit of claim 1 wherein the input of the transmission line is coupled to a first output of the voltage controlled oscillator and the second input of the phase detector is coupled to a second output of the voltage controlled oscillator.

6. The integrated circuit of claim 5 wherein the voltage controlled oscillator includes a plurality of outputs having equally spaced phases.

7. The integrated circuit of claim 1 wherein the phase detector comprises a phase frequency detector and a charge pump.

8. The integrated circuit of claim 1 wherein the integrated transmission line comprises one or more conductive interconnect layers.

9. The integrated circuit of claim 8 wherein the integrated transmission line comprises a plurality of metalization layers arranged in parallel.

10. The integrated circuit of claim 8 wherein the conductive interconnect layers are aluminum or copper.

11. The integrated circuit of claim 1 wherein the integrated transmission line is stripline or microstrip.

12. The integrated circuit of claim 1 further comprising a filter.

13. A method of generating an electronic signal comprising:
    delaying a first signal by a first delay in an integrated transmission line to produce a first delayed signal;
    coupling the first delayed signal in a feedback loop with at least one other signal, wherein the feedback loop includes a phase detector; and detecting a phase difference between the first delayed signal and said at least one other signal, and in accordance therewith, changing a voltage at an input of a voltage controlled oscillator, wherein an entire propagation time delay between the transmission line input and the transmission line output sets the frequency of the voltage controlled oscillator, and wherein the phase detector, the voltage controlled oscillator, and the transmission line are integrated on a single integrated circuit, wherein the voltage controlled oscillator output is conditioned to avoid locking onto fractional values of the entire propagation time delay.

14. The method of claim 13 wherein the period of an output signal at an output of the voltage controlled oscillator is equal to the first delay.

15. The method of claim 13 wherein the first signal is generated at a first output of the voltage controlled oscillator, and wherein said at least one other signal is generated at a second output of the voltage controlled oscillator.

16. The method of claim 15 wherein a phase difference between a first voltage controlled oscillator output signal and a second voltage controlled oscillator output signal is equal to said first delay.

* * * * *